(12) United States Patent
Shibuya

(10) Patent No.: US 9,499,904 B2
(45) Date of Patent: Nov. 22, 2016

(54) METHOD OF MANUFACTURING CARBON NANOTUBES

(71) Applicant: ZEON CORPORATION, Chiyoda-ku, Tokyo (JP)

(72) Inventor: Akiyoshi Shibuya, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 14/392,223

(22) PCT Filed: Jun. 26, 2014

(86) PCT No.: PCT/JP2014/003430
§ 371 (c)(1),
(2) Date: Dec. 24, 2015

(87) PCT Pub. No.: WO2014/208097
PCT Pub. Date: Dec. 31, 2014

(65) Prior Publication Data
US 2016/0273100 A1    Sep. 22, 2016

(30) Foreign Application Priority Data

Jun. 27, 2013 (JP) .................. 2013-135486

(51) Int. Cl.
*C23C 16/26* (2006.01)
*C23C 16/44* (2006.01)
(Continued)

(52) U.S. Cl.
CPC ....... *C23C 16/4405* (2013.01); *C01B 31/0233* (2013.01); *C23C 16/26* (2013.01);
(Continued)

(58) Field of Classification Search
CPC .............................. C23C 16/26; C23C 16/455
See application file for complete search history.

(56) References Cited

U.S. PATENT DOCUMENTS

2010/0196600 A1* 8/2010 Shibuya ................ B82Y 30/00
427/249.1
2011/0111177 A1* 5/2011 Hata ..................... B81C 1/0038
428/161
(Continued)

FOREIGN PATENT DOCUMENTS

| JP | 2003-146633 A | 5/2003 |
| JP | 2003144906 A | 5/2003 |
| JP | 2006-315889 A | 11/2006 |
| JP | 2007-131936 A | 5/2007 |
| JP | 2012-250862 A | 12/2012 |

OTHER PUBLICATIONS

Li, Yan, et al., "How Catalysts Affect the Growth of Single-Walled Carbon Nanotubes on Substrates". Advanced Materials, 2010, 22, 1508-1515.*

(Continued)

*Primary Examiner* — Bret Chen
(74) *Attorney, Agent, or Firm* — Kenja IP Law PC

(57) ABSTRACT

The disclosed method of manufacturing carbon nanotubes includes the steps of growing CNTs on a substrate 12 and cleaning the inside of a growth furnace 13 by supplying a cleaning gas that contains water into the growth furnace 13. In the cleaning step, the cleaning is performed such that $0.7 \leq (2[CO_2]+[CO])/[H_2] \leq 1.3$ is satisfied, where $[H_2]$, $[CO_2]$, and $[CO]$ denote the concentrations of hydrogen, carbon dioxide, and carbon monoxide, respectively, in a gas within the growth furnace 13.

6 Claims, 6 Drawing Sheets

(51) Int. Cl.
*C01B 31/02* (2006.01)
*B82Y 40/00* (2011.01)
*B82Y 30/00* (2011.01)
*C23C 16/54* (2006.01)
*C23C 16/02* (2006.01)

(52) U.S. Cl.
CPC ............... *B82Y 30/00* (2013.01); *B82Y 40/00* (2013.01); *C23C 16/0272* (2013.01); *C23C 16/54* (2013.01); *Y10S 977/742* (2013.01); *Y10S 977/843* (2013.01)

(56) References Cited

U.S. PATENT DOCUMENTS

2011/0308462 A1* 12/2011 Shibuya ................ B01J 15/005
    118/724
2013/0028829 A1* 1/2013 Hagopian ............. B82Y 40/00
    423/447.2

OTHER PUBLICATIONS

Balbuena, Perla B., et al., "Role of the Catalyst in the Growth of Single-Wall Carbon Nanotubes". Journal of Nanoscience and Nanotechnology, vol. 6, 1-12, 2006.*
Magrez, Arnaud, et al., "Catalytic CVD Synthesis of Carbon Nanotubes: Towards High Yield and Low Temperature Growth". Materials, 2010, 3, pp. 4871-4891.*
Zhou, Weiwei, et al., "Copper Catalyzing Growth of Single-Walled Carbon Nanotubes on Substrates". Nano Letters 2006, vol. 6, No. 12, 2987-2990.*
Dec. 29, 2015, International Preliminary Report on Patentability issued in the International Patent Application No. PCT/JP2014/003430.
Aug. 4, 2016, Extended European Search Report issued by the European Patent Office in the corresponding European Patent Application No. 14818752.9.

* cited by examiner

METHOD OF MANUFACTURING CARBON NANOTUBES

TECHNICAL FIELD

This disclosure relates to a method of manufacturing carbon nanotubes.

BACKGROUND

Manufacture of carbon nanotubes (hereinafter frequently referred to as "CNTs") by a chemical vapor deposition (hereinafter frequently referred to as "CVD") method or the like sometimes causes carbonaceous by-products (hereinafter frequently referred to as "carbon contaminants"), composed mainly of carbon contained in a source gas, to adhere to the inside of a manufacturing furnace. Such carbon contaminants can be removed by the methods described in JP2003146633A (PTL 1), JP2006315889A (PTL2), and JP2012250862A (PTL3), which are known in the art.

PTL 1 describes a method for gasifying carbon contaminants by supplying steam into a reaction tube used to manufacture CNTs. PTL 2 describes a method for discharging carbon contaminants in the form of carbon monoxide gas by introducing carbon dioxide into a reaction furnace used to manufacture carbon fibers and reacting the carbon dioxide with carbon contaminants. PTL 3 describes a method for removing carbon contaminants inside a growth furnace by using a cleaning gas that contains oxygen atoms.

JP2007131936A (PTL 4) describes a method for removing carbon in the form of soot or the like, which has been impregnated into the heat insulating material in a carburizing furnace, by injecting air to cause burnout.

CITATION LIST

Patent Literature

PTL 1: JP2003146633A
PTL 2: JP2006315889A
PTL 3: JP2012250862A
PTL 4: JP2007131936A

SUMMARY

Technical Problem

The manufacture of CNTs by a CVD method may cause carbon to permeate (or may cause carburizing of) the furnace wall and the components within the furnace. If the carburizing further progresses excessively, the structures near the surface layer of the furnace wall and the components within the furnace may become brittle, resulting in a problem of carbon contaminants, such as amorphous carbon, graphite, and carbonized metals, falling or peeling off the surface layer (excess carburizing). It has been empirically known that excess carburizing not only accelerate the replacement of a furnace itself and the components within a furnace but also may cause mixing of fallen carbon contaminants into the products, reduction in the production amount of CNTs, and deterioration in the quality of CNTs.

However, if cleaning is performed excessively to prevent excess carburizing, the furnace material itself may be oxidized by the excess cleaning, which is another problem.

PTL 1 is silent regarding monitoring of a cleaning status, nor does it make any reference to oxidation of the furnace material caused by excess cleaning.

On the other hand, PTL 2 describes monitoring of a cleaning status by for example measuring the temperature change, weight change, or pressure change during cleaning, or concentration of carbon monoxide gas generated by cleaning. However, PTL 2 does not make any reference to oxidation of the furnace material caused by excess cleaning, thus failing to solve the problems even with the results obtained by the above-mentioned measurement.

Turning to PTL 3 where CNTs are consecutively manufactured, although PTL 3 describes conducting cleaning when quality deterioration of CNTs occurs, no reference is made to oxidation of the furnace material caused by excess cleaning.

Further, although PTL 4 describes monitoring of carbon dioxide concentration and oxide concentration to determine when to end the cleaning, it does not make any reference to oxidation of the furnace material caused by excess cleaning. Moreover, PTL 4 is silent regarding the manufacture of CNTs.

The method to be disclosed herein has been developed in view of the above problems. An object herein is to provide a method of manufacturing CNTs designed to prevent oxidation of a furnace material caused by excess cleaning.

Solution to Problem

To solve the above problems, a method of manufacturing carbon nanotubes according to the disclosure, which is performed by growing carbon nanotubes on a substrate that supports a catalyst on a surface thereof, comprises the steps of: growing carbon nanotubes on the substrate by supplying a source gas of carbon nanotubes to the catalyst of the substrate introduced into a growth furnace and heating at least one of the catalyst and the source gas; and cleaning the inside of the growth furnace by supplying a cleaning gas that contains water into the growth furnace, wherein in the cleaning step, the inside of the growth furnace is cleaned such that a hydrogen concentration $[H_2]$, a carbon dioxide concentration $[CO_2]$, and a carbon monoxide concentration $[CO]$ in a gas within the growth furnace satisfy the following condition (1)

$$0.7 \leq \{(2[CO_2]+[CO])/[H_2]\} \leq 1.3 \quad (1).$$

In the method of manufacturing carbon nanotubes according to the disclosure, it is preferable in the growing step that a catalyst activating material be supplied to the catalyst of the substrate in addition to the source gas.

In the method of manufacturing carbon nanotubes according to the disclosure, it is more preferable in the cleaning step that the inside of the growth furnace be cleaned such that the following condition (2)

$$0 < ([CO]/[CO_2]) \leq 10 \quad (2)$$

is satisfied.

Further, in the method of manufacturing carbon nanotubes according to the disclosure, it is more preferable that the growth furnace at least partially contain metal.

Still further, in the method of manufacturing carbon nanotubes according to the disclosure, it is more preferable that the cleaning step comprise monitoring $(2[CO_2]+[CO])/[H_2]$ within the growth furnace.

Still further, in the method of manufacturing carbon nanotubes according to the disclosure, it is more preferable that the cleaning step comprise monitoring $[CO]/[CO_2]$ within the growth furnace.

Advantageous Effect

The disclosed method is designed to clean the growth furnace such that the concentrations of hydrogen, carbon dioxide, and carbon monoxide in the gas inside the growth furnace fall within a specific range, making it possible to prevent oxidation of the furnace material caused by excess cleaning.

DETAILED DESCRIPTION

Figure 1:
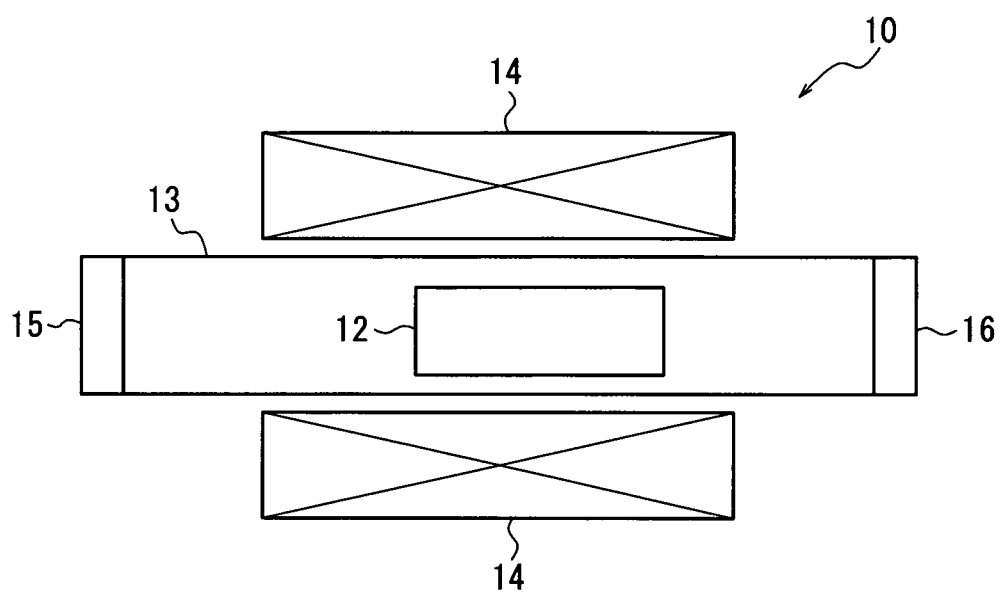
FIG. 1 schematically illustrates an example of a manufacturing apparatus used in the manufacturing method according to one embodiment.

Embodiments will be described below in detail. The method of manufacturing carbon nanotubes according to the disclosure is a method of manufacturing CNTs by growing CNTs on a substrate that supports a catalyst on the surface of the substrate. The method of manufacturing CNTs includes a growing step and a cleaning step.

[Growing Step]

The growing step includes supplying a source gas of CNTs and optionally a catalyst activating material to the catalyst of the substrate introduced into the growth furnace, and heating the catalyst and/or the source gas to grow CNTs on the substrate. In a word, the growing step includes growing CNTs on the substrate by for example a chemical vapor deposition (CVD) method. The CNTs grown by the growing step is preferably an aligned CNT aggregate, more preferably an aligned CNT aggregate oriented vertically to the substrate.

(Aligned CNT Aggregate)

The aligned CNT aggregate is a structure in which a number of CNTs grown from the substrate are oriented in a particular direction.

A preferred BET specific surface area of the aligned CNT aggregate is 600 m$^2$/g or more, preferably 800 m$^2$/g or more, for the CNTs that are mostly unopened. Higher BET specific surface areas are preferred because impurities such as metals or carbon impurities can be reduced to less than several tens percent of the weight (about 40%).

A preferred weight density of the aligned CNT aggregate is 0.002 g/cm$^3$ or more and 0.2 g/cm$^3$ or less. If the weight density is 0.2 g/cm$^3$ or less, the binding between CNTs constituting the aligned CNT aggregate weakens, making it easier to homogenously disperse the CNTs when the aligned CNT aggregate is stirred in a solvent or the like. In other words, setting the weight density to be 0.2 g/cm$^3$ or less makes it easier to obtain a homogenous dispersion liquid. If the weight density is 0.002 g/cm$^3$ or more, the unity of the aligned CNT aggregate improves, preventing the CNTs from becoming unbound and making the aligned CNT aggregate easier to handle.

An aligned CNT aggregate oriented in a particular direction preferably has high orientation. In this context, "having high orientation" refers to satisfying at least one of conditions 1. to 3. below.

1. When the aligned CNT aggregate is irradiated with X rays from a first direction parallel with the longitudinal direction of the CNTs and from a second direction orthogonal to the first direction, and an x-ray diffraction intensity is measured ($\theta$–2$\theta$ method), a $\theta$ angle and a reflection direction exist such that the reflection intensity from the second direction is greater than the reflection intensity from the first direction. Furthermore, a $\theta$ angle and a reflection direction exist such that the reflection intensity from the first direction is greater than the reflection intensity from the second direction.

2. When the X-ray diffraction intensity is measured from a two-dimensional diffraction pattern image obtained by irradiating the aligned CNT aggregate with X rays from the direction orthogonal to the longitudinal direction (second direction) of the CNTs (this measurement is called a Laue method), a diffraction peak pattern indicating the presence of anisotropy appears.

3. A Herman's orientation factor calculated using the X-ray diffraction intensity obtained by the $\theta$–2$\theta$ method or the Laue method is greater than 0 and is 1 or less, preferably 0.25 or more and 1 or less.

The aligned CNT aggregate is preferably such that in the above-described X-ray diffraction, (i) diffraction intensities of a (CP) diffraction peak and a (002) peak based on packing between single-walled CNTs and (ii) diffraction peak intensities in the directions of X-rays that enter parallel (first direction) and perpendicular (second direction) to (100) and (110) peaks based on a six-membered carbon ring constituting the single-walled CNTs are different from each other.

In order for the aligned CNT aggregate to exhibit a high orientation and a high specific surface area, the height (length) of the aligned CNT aggregate is preferably in a range of 10 μm or more to 10 cm or less. A height of 10 μm or more improves the orientation, while a height of 10 cm or less allows for rapid CNT generation, thereby suppressing the adhesion of carbonaceous impurities and improving the specific surface area.

The G/D ratio of the CNTs constituting the aligned CNT aggregate is preferably 3 or more, and more preferably 4 or more. The G/D ratio is an index commonly used to evaluate the quality of CNTs. In a Raman spectrum of CNTs as measured by a Raman spectroscopic instrument, vibration modes referred to as the "G band" (near 1,600 cm$^{-1}$) and "D band" (near 1,350 cm$^{-1}$) are observed. The G band is a vibration mode based on hexagonal lattice structures of graphite appearing as cylindrical surfaces of the CNTs, and the D band is a vibration mode based on amorphous locations. Therefore, as the peak intensity ratio of the G band to the D band (G/D ratio) is higher, the CNTs are evaluated as being more highly crystalline.

(CNT Manufacturing Apparatus)

With reference to FIG. 1, the growing step will be described in detail. FIG. 1 schematically illustrates an example of a manufacturing apparatus used in the manufacturing method according to one embodiment. A CNT manufacturing includes a growth furnace 13, heaters 14, a gas inlet 15, and a gas outlet 16. A substrate 12 on which CNTs are grown is introduced into the growth furnace 13.

The CNT manufacturing apparatus 10 is a batch-type manufacturing apparatus that performs a formation step described below and the growing step in one furnace (growth furnace 13). In the CNT manufacturing apparatus 10, for example, gases necessary in the formation step and the growing step may be supplied from the gas inlet 15. This offers the advantage of forming a catalyst layer on a base plate more uniformly.

When carrying out the growing step in the CNT manufacturing apparatus 10, the environment around the catalyst is set to a source gas environment, and CNTs are grown by heating at least one of the catalyst and the source gas.

In the growing step, it suffices to grow CNTs on the substrate 12 by a CVD method either after the CNT source gas and catalyst activating material are supplied, or while the source gas and catalyst activating material are being supplied to the growth furnace 13 into which the substrate 12 has been introduced. In the growing step, the CNT production efficiency and purity can be even further improved by causing the catalyst activating material to be present in the atmosphere in which the CNT growth reaction occurs, although the catalyst activating material is not necessarily used in the growing step.

In heating at least one of the catalyst and the source gas, it is more preferred to heat both. The reaction temperature at which CNTs are grown is appropriately determined depending on the types and concentrations of the catalyst and the source gas, reaction pressure, and like, yet the reaction temperature is desirably set to a temperature range that allows for sufficient expression of the effects of the catalyst activating material to exclude secondary products that may cause catalyst deactivation. In other words, the most desirable temperature range is from a lower limit at which the catalyst activating material can remove secondary products, such as amorphous carbon and graphite, to an upper limit at which CNTs, which are primary products, are not oxidized by the catalyst activating material. Thus, the temperature to heat at least one of the catalyst and the source gas may be any temperature that allows for CNT growth, yet the temperature is preferably 400° C. or more to 1100° C. or less, and more preferably 600° C. or more to 900° C. or less. If the temperature is in this range, the effects of the catalyst activating material can be expressed well, and the reaction between the catalyst activating material and CNTs can be suppressed.

The pressure within the growth furnace 13 in the growing step is preferably $10^2$ Pa or more to $10^7$ Pa (100 atm) or less and more preferably $10^4$ Pa or more to $3 \times 10^5$ Pa (3 atm) or less.

<Source Gas>

The source gas may be any gas material that serves as raw material for CNTs. For example, the source gas may be a gas that has a raw-material carbon source at the temperature at which CNTs grow. Among these gases, hydrocarbons such as methane, ethane, ethylene, propane, butane, pentane, hexane, heptane, propylene, and acetylene are suitable as the source gas. Ethylene allows for efficient manufacturing of CNTs and is therefore particularly suitable. In addition, gases of lower alcohols such as methanol, ethanol, and the like may also be used as the source gas. A mixture of these gases may also be used. Furthermore, the source gas may be diluted with an inert gas.

<Inert Gas>

The inert gas may be any gas that is inert at the temperature at which the CNTs grow, that does not reduce the activity of the catalyst, and that does not react with the growing CNTs. Examples include helium, argon, nitrogen, neon, krypton, and a mixture of any of these. In particular, nitrogen, helium, argon, and mixtures thereof are suitable.

<Catalyst Activating Material>

As the catalyst activating material, a material that includes oxygen is preferable, and a material that does not inflict significant damage on the CNTs at the CNT growth temperature is even more preferable. Effective examples include water, oxygen, ozone, acidic gases, and nitrogen oxide; oxygen-containing compounds having a low carbon number, such as carbon monoxide and carbon dioxide; alcohols such as ethanol and methanol; ethers such as tetrahydrofuran; ketones such as acetone; aldehydes; esters; and mixtures thereof. Among these, water, oxygen, carbon dioxide, carbon monoxide, and ethers are preferable as the catalyst activating material, with water and carbon dioxide being particularly suitable.

The amount of catalyst activating material added is not limited to a specific amount, yet in terms of concentration by volume in the environment around the catalyst, when the catalyst activating material is water, the water may be added preferably in a range of 10 ppm or more to 10000 ppm or less, more preferably 50 ppm or more to 1000 ppm or less, and even more preferably 100 ppm or more to 700 ppm or less. When the catalyst activating material is carbon dioxide, the concentration of carbon dioxide in the environment around the catalyst is preferably 0.2 vol % to 70 vol %, more preferably 0.3 vol % to 50 vol %, and even more preferably 0.7 vol % to 20 vol %.

The mechanism by which the catalyst activating material functions as desired is currently inferred to be as follows. In the process of growth of the CNTs, adhesion of by-products such as amorphous carbon and graphite to the catalyst causes deactivation of the catalyst, and the growth of the CNTs is therefore inhibited. However, the presence of the catalyst activating material causes amorphous carbon, graphite and the like to be oxidized into carbon monoxide, carbon dioxide, and the like, and therefore gasified. Hence, the catalyst activating material is believed to cleanse the catalyst and express the function of enhancing the activity and extending the active life of the catalyst (catalyst activating effect).

A compound that includes carbon and oxygen, such as alcohols or carbon monoxide, may act as the source gas or as the catalyst activating material. For example, when using these compounds in combination with a source gas that easily decomposes to become a carbon source, such as ethylene, the compounds that includes carbon and oxygen act as a catalyst activating material. On the other hand, when using these compounds that include carbon and oxygen in combination with a highly active catalyst activating material such as water, it is inferred that the compounds that include carbon and oxygen act as a source gas. Furthermore, it is inferred that carbon monoxide and the like decompose into carbon atoms that become a carbon source for the CNT growth reaction and into oxygen atoms that act as a catalyst activating material by oxidizing and gasifying amorphous carbon, graphite, and the like.

<Environment of High Carbon Concentration>

The growing step is preferably performed under an environment of high carbon concentration. An environment of high carbon concentration refers to a growth atmosphere in which the volume percentage of the source gas is approximately 2% to 20% in the environment around the catalyst. In particular, since the activity of the catalyst remarkably improves in the presence of the catalyst activating material, the catalyst is not deactivated even in an environment of high carbon concentration. CNT growth over an extended period of time is therefore possible, and the growth rate also remarkably improves. However, in an environment of high carbon concentration, a large amount of carbon contaminants adheres to the furnace wall and the like as compared to an environment of low carbon concentration. With the disclosed manufacturing method, the CNT growth environment can be maintained as an optimal environment, thereby preventing adhesion of carbon contaminants and allowing for efficient manufacturing of high-quality CNTs.

<Substrate>

Next, the substrate 12 used in the growing step is described. The substrate 12 supports a catalyst for a CNT growth reaction on the surface thereof.

The member forming the substrate 12 may be any member capable of supporting a catalyst for a CNT growth reaction on the surface thereof. The substrate is preferably capable of maintaining its shape even at a high temperature of 400° C. or above. Examples of materials include: metals such as iron, nickel, chromium, molybdenum, tungsten, titanium, aluminum, manganese, cobalt, copper, silver, gold, platinum, niobium, tantalum, lead, zinc, gallium, indium, germanium, and antimony; alloys and oxides containing any of these metals; nonmetals such as silicon, quartz, glass, mica, graphite, and diamond; and ceramic. Metals are preferable due to being lower in cost than nonmetals and ceramic. In particular, a Fe—Cr (iron-chromium) alloy, a Fe—Ni (iron-nickel) alloy, a Fe—Cr—Ni (iron-chromium-nickel) alloy, and the like are suitable.

Examples of the form of the substrate include a flat plate, a thin film, a block, and powder. In particular, a flat plate or powder allows for a large surface area for its volume and thus is advantageous for mass production of CNTs.

When using a flat base plate as the substrate, the thickness of the base plate is not limited and may, for example, be anywhere from a thin film of approximately several micrometers up to a plate of approximately several centimeters. The thickness of base plate is preferably 0.05 mm or more to 3 mm or less. If the thickness of the base plate is 3 mm or less, the base plate can be sufficiently heated in the CVD step, thereby both suppressing poor growth of CNTs and reducing the cost of the base plate. If the thickness of the base plate is 0.05 mm or more, a deformation of the base plate due to carburizing can be suppressed and is also advantageous for transfer and reuse of the base plate, since the base plate itself does not easily warp. Carburizing of the base plate refers to permeation of a carbon component into the base plate.

The shape and size of a flat base plate used as the substrate are not limited. The substrate may be rectangular or square. The size of one side of the base plate is not limited, yet from the perspective of high-volume production of CNTs, a larger base plate is preferable. A large base plate may be suitably used. For example, according to the disclosure, CNTs can be manufactured more uniformly on a base plate that measures 100 mm or more to 1000 mm or less on a side.

<Carburizing Prevention Layer>

The flat base plate used as the substrate may have a carburizing prevention layer formed on the front or back surface thereof, or on both. It is desirable that the substrate have a carburizing prevention layer formed on both the front and back surfaces thereof. The carburizing prevention layer is a protective layer for preventing the base plate from being carburized and therefore deformed in the growing step.

The carburizing prevention layer is preferably formed from a metal or ceramic material. Ceramic material is highly effective in preventing carburizing and hence is particularly preferable. Examples of the metal include copper and aluminum. Examples of the ceramic material include oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among these, aluminum oxide and silicon oxide are preferable because they are highly effective in preventing carburizing.

<Catalyst>

A catalyst is supported on the substrate (on the carburizing prevention layer when the carburizing prevention layer is formed on the base plate). Examples of the catalyst include iron, nickel, cobalt, and molybdenum, and also a chloride or alloy of any of these. The catalyst may also be a complex or a layer of any of these with aluminum, alumina, titania, titanium nitride, silicon oxide, or the like. Examples of the catalyst include an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst may be present in any amount within a range allowing for production of CNTs. For example, when using iron, the thickness of the iron thin layer formed is preferably 0.1 nm or more to 100 nm or less, more preferably 0.5 nm or more to 5 nm or less, and particularly preferably 0.8 nm or more to 2 nm or less.

Either a wet or dry process may be applied for formation of the catalyst on the surface of the substrate. Specifically, a sputtering evaporation method or a method for spreading/calcining a liquid obtained by dispersing fine metal particles in an appropriate solvent may be applied. Furthermore, it is possible to form an area supporting the catalyst on the substrate surface into any shape by concomitant use of patterning that applies well-known photolithography, nanoimprinting, or the like.

The growing step makes it possible to control the shape of the aligned CNT aggregate freely via patterning of the catalyst formed on the substrate and the CNT growth time, so as to yield a thin film shape, cylindrical shape, prismatic shape, or any other complicated shape. In particular, in the shape of a thin film, the aligned CNT aggregate has an extremely small thickness (height) as compared to its length and width. However, the length and width can be freely controlled by the catalyst patterning, and the thickness can be freely controlled by the growth time for the CNTs that constitute the aligned CNT aggregate.

<Catalyst Formation Wet Process>

The wet process for forming a catalyst layer on the surface of the substrate includes the steps of applying a coating agent on the substrate, and heating the applied coating agent. The coating agent is obtained by dissolving a metal organic compound and/or a metal salt containing an element to serve as a catalyst in an organic solvent. A stabilizer may be added to the coating agent to suppress a condensation polymerization reaction of the metal organic compound and the metal salt.

In the application step, any method, including application by spraying, brushing, spin coating, and dip coating, may be used, yet dip coating is preferable from the perspective of productivity and control of film thickness.

The heating step is preferably performed after the application step. Heating initiates hydrolysis and condensation polymerization reaction of the metal organic compound and the metal salt, allowing for formation of a cured coating containing metal hydroxide and/or metal oxide on the surface of the substrate. The heating temperature and the heating time are preferably adjusted as appropriate according to the type of catalyst thin film to be formed, within a range of approximately 50° C. or more to 400° C. or less and within a range of 5 minutes or more to 3 hours or less.

For example, when an alumina-iron thin film is formed as a catalyst, an alumina film is formed before an iron thin film is formed.

The metal organic compound and/or metal salt for forming an alumina thin film may be aluminum alkoxide such as aluminum trimethoxide, aluminum triethoxide, aluminum tri-n-propoxide, aluminum tri-i-propoxide, aluminum tri-n-butoxide, aluminum tri-sec-butoxide, and aluminum tri-tert-butoxide. These may be used alone or in combination. Another example of the metal organic compound containing aluminum may be a complex of tris(acetylacetonato)aluminum(III) or the like. The metal salt may be aluminum sulfate, aluminum chloride, aluminum nitrate, aluminum bromide, aluminum iodide, aluminum lactate, basic aluminum chlorides, basic aluminum nitrate, or the like. These compounds may be used alone or in combination of two or more thereof. Among these, aluminum alkoxide is preferably used.

The metal organic compound and/or the metal salt for forming an iron thin film may be iron pentacarbonyl, ferrocene, acetylacetone iron(II), acetylacetone iron(III), trifluoroacetylacetone iron(II), trifluoroacetylacetone iron(III), or the like. Examples of the metal salt include inorganic acid iron, such as iron sulfate, iron nitrate, iron phosphate, iron chloride, and iron bromide; and organic acid iron, such as iron acetate, iron oxalate, iron citrate, and iron lactate. These compounds may be used alone or in combination of two or more thereof. Of these, organic acid iron is preferably used.

The stabilizer is preferably at least one selected from the group consisting of β-diketones and alkanolamines. These compounds may be used alone or in combination of two or more thereof. β-diketones include acetylacetone, methyl acetoacetate, ethyl acetoacetate, benzoylacetone, dibenzoylmethane, benzoyltrifluoracetone, furoylacetone, trifluoroacetylacetone, and the like, among which acetylacetone and ethyl acetoacetate are preferably used in particular. Alkanolamines include monoethanolamine, diethanolamine, triethanolamine, N-methyldiethanolamine, N-ethyldiethanolamine, N,N-dimethylaminoethanol, diisopropanolamine, triisopropanolamine, and the like, among which secondary or tertiary alkanolamine is preferably used.

Various organic solvents can be used as the organic solvent, including alcohol, glycol, ketone, ether, esters, and hydrocabons, among which alcohol or glycol is preferably used because it dissolves metal organic compounds and metal salts well. These organic solvents may be used alone or in combination of two or more thereof. The alcohol is preferably methanol, ethanol, isopropyl alcohol, or the like in terms of handleability and preservation stability.

<Growth Furnace>

The growth furnace 13 is a furnace for making an ambient environment of the substrate 12 to a source gas environment and retaining the source gas environment, and is a furnace for storing the substrate 12 when growing CNTs. The growth furnace 13 at least partially contains metal. The bottom of the growth furnace 13 acts as a mounting surface for the substrate 12. The substrate 12 is mounted on the mounting surface during the growing step.

The gas inlet 15 and the gas outlet 16 are disposed on the sides of the growth furnace 13. The gas inlet 15 and the gas outlet 16 are disposed to oppose each other. Gases such as a source gas introduced from the gas inlet 15 is discharged from the gas outlet 16. A known mechanism may be used as appropriate as the mechanism for discharging the gas from the gas outlet 16, for example suction means such as a pump or the like.

<Heater>

The heaters 14 heat at least one of the catalyst and the source gas. The heaters 14 include a bottom side heater positioned below the growth furnace 13 and a top side heater positioned above the growth furnace 13. The CNT manufacturing apparatus 10 may further include lateral side heaters positioned on the sides of the growth furnace 13. In other words, the heaters 14 may be provided so as to surround the area around the growth furnace 13.

In the growing step, by heating the inside of the growth furnace 13 from the outside of the growth furnace 13 with the heaters 14, at least one of the catalyst supported on the substrate 12 introduced into the growth furnace 13 and the source gas supplied into the growth furnace 13 is heated.

The heaters 14 may be any type of heater that can heat the growth furnace 13, yet a heater capable of heating within a range of 400° C. to 1100° C. is preferable, and examples thereof include a resistance heater, an infrared heater, an electromagnetic induction heater, and the like.

[Cleaning Step]

In the cleaning step, a cleaning gas that contains water is supplied into the growth furnace 13 to clean the inside of the growth furnace 13. In the cleaning step, by supplying the cleaning gas into the growth furnace 13, carbon contaminants adhered to the furnace wall and the surface of the components within the furnace are gasified. Further, carbon that has permeated the inside of the furnace wall and the components within the furnace is diffused outside (which may be also referred to as "decarburizing") to be gasified. In other words, cleaning refers to gasifying and then removing the carbonaceous by-products (carbon contaminants), such as amorphous carbon and graphite, adhered to the furnace wall and the surface of the components within the furnace as well as the carbon that has permeated the inside of the furnace wall and the components within the furnace.

(Cleaning Gas)

The cleaning gas may be any gas that can clean the furnace wall and the components within the growth furnace 13, and at least contains water. When the growth furnace 13 is made of metal, the use of the cleaning gas containing water can reduce the occurrence of oxidation within the growth furnace 13, as compared to a case where oxygen is used as a cleaning gas. For example, water vapor may be used as the cleaning gas. The cleaning gas may further contain for example an inert gas other than the gas that contains water. From the perspective of removing the carbon contaminants adhered to the furnace wall, the components within the furnace, and the like, the cleaning gas preferably does not contain a carbon atom.

In the cleaning step, the inside of the growth furnace 13 is cleaned such that the hydrogen concentration [$H_2$], the carbon dioxide concentration [$CO_2$], and the carbon monoxide concentration [$CO$] in a gas within the growth furnace 13 satisfy the following condition (1)

$$0.7 \leq \{(2[CO_2]+[CO])/[H_2]\} \leq 1.3 \quad (1).$$

The hydrogen concentration [H$_2$], the carbon dioxide concentration [CO$_2$], and the carbon monoxide concentration [CO] in the gas within the growth furnace 13 in the cleaning step are all represented as a concentration by volume.

When cleaning the inside of the growth furnace 13 using the cleaning gas that contains water, the following three types of chemical reaction will occur near the surface layer of the furnace wall and the components within the furnace.

$$H_2O + C \rightarrow CO + H_2 \quad (a)$$

$$2H_2O + C \rightarrow CO_2 + 2H_2 \quad (b)$$

$$xH_2O + yM \rightarrow M_yO_x + xH_2 \quad (c)$$

(M represents metal, and x and y represent any number)

Thus, in the cleaning step, cleaning the inside of the growth furnace 13 such that (2[CO$_2$]+[CO])/[H$_2$] falls within a range of 0.7 or more to 1.3 or less allows for suitable removal of the carbon contaminants within the growth furnace 13 while preventing occurrence of the reaction (c) above, or specifically oxidation reaction of the furnace wall and the components within the furnace. It is empirically known that structures of oxidized furnace wall and components within the furnace are carburized more rapidly. However, the method disclosed herein allows for prevention of oxidation of the furnace wall and the components within the furnace caused by excess cleaning. Stoichiometrically, (2[CO$_2$]+[CO])/[H$_2$] would not exceed 1. However, in reality, side reactions may occur among hydrogen, carbon monoxide, and carbon dioxide generated by the above-described chemical reaction. The upper limit was therefore set to 1.3 to cover such a case.

In the cleaning step, it is more preferable that the inside of the growth furnace 13 be cleaned such that (2[CO$_2$]+[CO])/[H$_2$] falls within a range of 0.8 or more to 1.1 or less, and it is most preferable that the inside of the growth furnace 13 be cleaned such that (2[CO$_2$]+[CO])/[H$_2$] equals to 1. In the ideal cleaning step where the inside of the growth furnace 13 is cleaned such that (2[CO$_2$]+[CO])/[H$_2$] equals to 1, the reaction (c), or specifically oxidation reaction of the furnace wall and the components within the furnace, would not occur.

The concentrations of hydrogen, carbon dioxide, and carbon monoxide in the gas within the growth furnace 13, which are denoted by [H$_2$], [CO$_2$], and [CO], respectively, are intended to refer to the concentrations of hydrogen, carbon dioxide, and carbon monoxide which are generated by the reaction between the water in the cleaning gas introduced in the cleaning step and the materials within the growth furnace 13. Whether the hydrogen, carbon dioxide, and carbon monoxide in the gas within the growth furnace 13 are those generated by the reaction between the water in the cleaning gas and the materials within the growth furnace 13 can be determined by comparing the concentrations of the hydrogen, carbon dioxide, and carbon monoxide in the growth furnace 13 before the introduction of the cleaning gas with the concentrations of the hydrogen, carbon dioxide, and carbon monoxide after the introduction of the cleaning gas.

The manufacture of CNTs by a CVD method may cause carbon to permeate (or may cause carburizing of) the furnace wall and the components within the furnace. If the carburizing further progresses excessively, the structures near the surface layer of the furnace wall and the components within the furnace may become brittle, resulting in a problem of carbon contaminants, such as amorphous carbon, graphite, and carbonized metals, falling or peeling off the surface layer (excess carburizing). It has been empirically known that excess carburizing not only accelerate the replacement of a furnace itself and the components within the furnace but also may cause mixing of fallen carbon contaminants into the products, reduction in the production amount of CNTs, and deterioration in the quality of CNTs. In other words, cleaning after occurrence of excess carburizing may not successfully restore the brittle structures of the furnace wall and the components within the furnace to their original state. Further, it is empirically known that although the carbon having permeated the brittle structures can be removed by cleaning (decarburizing), the brittle structures are carburized more rapidly in the next growing step. Therefore, the manufacture of CNTs by a CVD method needs cleaning before excess carburizing progresses excessively.

It has been discovered that the reaction between the water in the cleaning gas and the carbon in the carbon contaminants, which are adhered for example to the furnace wall and the components within the furnace or fallen off or peeled off by excess carburizing, mainly causes the reaction (a) to progress, and that the reaction between the water in the cleaning gas and the carbon having permeated the furnace wall and the component within the furnace mainly causes the reaction (b) to progress. It has been further discovered that in the state before excess carburizing occurs (in a normal carburizing state), the reaction between water and the carbon having permeated the furnace wall and the components within the furnace occurs at a higher rate, thus causing the reaction (b) above to mainly progress to result in a larger amount of carbon dioxide to be generated than carbon monoxide; and that in the state of excess carburizing, the reaction between water and the carbon in the carbon contaminants fallen off or peeled off occurs at a higher rate, thus causing the reaction (a) above to mainly progress to result in a larger amount of carbon monoxide to be generated than carbon dioxide. In a word, it has been discovered that whether the furnace wall and the components within the furnace are excessively carburized can be determined by referring to the value of [CO]/[CO$_2$].

Accordingly, in the cleaning step, the inside of the growth furnace is cleaned such that $$0 < ([CO]/[CO_2]) \leq 10 \quad (2)$$

is satisfied. The cleaning step performed to satisfy such a range will allow the cleaning to be ensured without failure before excess carburizing of the furnace wall and the components within the furnace to progress excessively. As a result, occurrence of excess carburizing can be prevented.

In the cleaning step, more preferably, the inside of the growth furnace 13 is cleaned such that $0 < ([CO]/[CO_2]) \leq 3$ is satisfied, and even more preferably the inside of the growth furnace 13 is cleaned such that $0 < ([CO]/[CO_2]) \leq 1$ is satisfied.

As in the above, the cleaning based on the concentrations of hydrogen, carbon dioxide, and carbon monoxide within the growth furnace 13 in the cleaning step can achieve just enough cleaning. This allows for longer life of the growth furnace and efficient cleaning, which can consequently improve the yield of CNT manufacturing.

In the cleaning step, in order to perform cleaning such that the concentrations of hydrogen, carbon dioxide, and carbon monoxide within the growth furnace 13 to fall within the range specified in the condition (1) or to fall within the ranges specified in the conditions (1) and (2), it suffices to appropriately adjust cleaning conditions, such as the amount of the cleaning gas to be supplied, the amount of water in the cleaning gas, the temperature within the growth furnace 13 during the cleaning step, the cleaning time, and the like. Since the concentrations of the hydrogen, carbon dioxide, and carbon monoxide in the growth furnace 13 vary depending on the state within the growth furnace 13 (state of adherence of carbon contaminants, state of carburizing, etc.), cleaning is performed while appropriately adjusting the cleaning conditions to achieve the above range.

For example, the amount of water in the cleaning gas may be 1000 ppm or more to 100000 ppm or less, more preferably 2000 ppm or more to 50000 ppm or less, and even more preferably 4000 ppm or more to 30000 ppm or less, in concentration by volume. The water amount in the cleaning gas in such a range allows the carbon contaminants adhered to the furnace wall and the components within the furnace to be suitably removed, so that high-quality CNTs can be manufactured immediately after the cleaning.

For example, the temperature within the growth furnace 13 in the cleaning step may be 600° C. or more to 1100° C. or less, more preferably 700° C. or more to 1000° C. or less, and even more preferably 750° C. or more to 900° C. or less. The temperature within the growth furnace 13 in the cleaning step in such a range allows for rapid removal of carbon contaminants adhered to the furnace wall and the components within the furnace. Further, the temperature difference within the growth furnace 13 is small between the cleaning step and the growing step. Thus, the growing step can be started after the cleaning step within a shorter time when the growing step and the cleaning step are consecutively performed, so that high-quality CNTs can be manufactured with increased productivity.

For example, the cleaning time in the cleaning step may be 1 hour or more to 100 hours or less, more preferably 3 hours or more to 50 hours or less, and even more preferably 5 hours or more to 20 hours or less. The cleaning time in such a range allows for rapid and efficient cleaning of the inside of the growth furnace 13.

In the disclosed CNT manufacturing method, the growing step and the cleaning step are performed individually. The cleaning step may be performed alternately with the growing step, or may be performed at a suitable timing after repeatedly performing the growing step several times. Alternatively, the cleaning step may be performed only when the quality of the grown CNTs, evaluated while being grown, does not satisfy predetermined conditions. The quality of CNTs can be evaluated by for example the above-described G/D ratio and the like.

In this regard, the cleaning is started before $0<([CO]/[CO_2])\leq10$ is exceeded because the cleaning step needs to be done before excess carburizing progresses excessively within the growth furnace 13. In other words, the cleaning may be started at the timing when $[CO]/[CO_2]$ does not exceed 10. This can be enabled by previously finding the conditions for the growing step that do not cause $[CO]/[CO_2]$ to exceed 10, or by introducing, at every predetermined time period, a gas that contains water into the growth furnace 13, where no substrate has been introduced, to react the gas with the materials within growth furnace 13 and performing gas measurement within the growth furnace 13.

In this way, the value of $[CO]/[CO_2]$ can be used as an index for starting the cleaning. Further, the value within a range of $0<([CO]/[CO_2])\leq10$ allows for determination that excess carburizing has not been caused.

As in the above, the phrase "in the cleaning step, the inside of the growth furnace is cleaned such that $0<[CO]/[CO_2]\leq10$ is satisfied" also covers adjusting the growing step conditions such that $[CO]/[CO_2]$ falls to 10 or less when the cleaning is started.

The cleaning needs to be ended before oxidation is caused inside the growth furnace. Thus, the cleaning is ended before the value falls outside the range of $0.7\leq\{(2[CO_2]+[CO])/[H_2]\}\leq1.3$; that is, the value of $(2[CO_2]+[CO])/[H_2]$ can be used as an index for ending the cleaning. In other words, $(2[CO_2]+[CO])/[H_2]$ within the above range allows the cleaning to be continued until carbon contaminants reach a desired level.

The cleaning step may further include monitoring the measurement of $(2[CO_2]+[CO])/[H_2]$ within the growth furnace 13. By monitoring the value of $(2[CO_2]+[CO])/[H_2]$ during cleaning, the oxidation state within the growth furnace 13 can be suitably determined, which allows for suitable determination of the timing to end the cleaning. Specifically, by monitoring the trend in variation with time of the value of $(2[CO_2]+[CO])/[H_2]$, the cleaning step can be ended before the value of $(2[CO_2]+[CO])/[H_2]$ falls below 0.7 or exceeds 1.3.

Alternatively, in the cleaning step, in order to prevent the value of $(2[CO_2]+[CO])/[H_2]$ within the growth furnace 13 to fall below 0.7 or to exceed 1.3, conditions for performing the cleaning step (for example, one or more of any of water amount in the cleaning gas, flow rate of cleaning gas, temperature within the growth furnace, and the like) may be adjusted.

The cleaning step may further include monitoring the measurement of $[CO]/[CO_2]$ within the growth furnace. By monitoring the value of $[CO]/[CO_2]$ during the cleaning, the carburizing state within the growth furnace 13 can be determined.

Alternatively, in the cleaning step, if $[CO]/[CO_2]$ measured immediately after starting the cleaning already indicates a value about to exceed 10, by adjusting the cleaning conditions such that high cleaning effect can be obtained, occurrence of excess carburizing can be prevented more effectively.

Specifically, in the cleaning step, by monitoring the value of $[CO]/[CO_2]$ to determine the removal levels of carbon contaminants and carburizing within the growth furnace 13, conditions for performing the cleaning step (for example, one or more of any of water amount in the cleaning gas, flow rate of cleaning gas, and temperature within the growth furnace; and starting time and ending time of the cleaning step) may be adjusted in order to prevent the value of $[CO]/[CO_2]$ from exceeding 10.

[CNT Manufacturing Apparatus]

Figure 2:
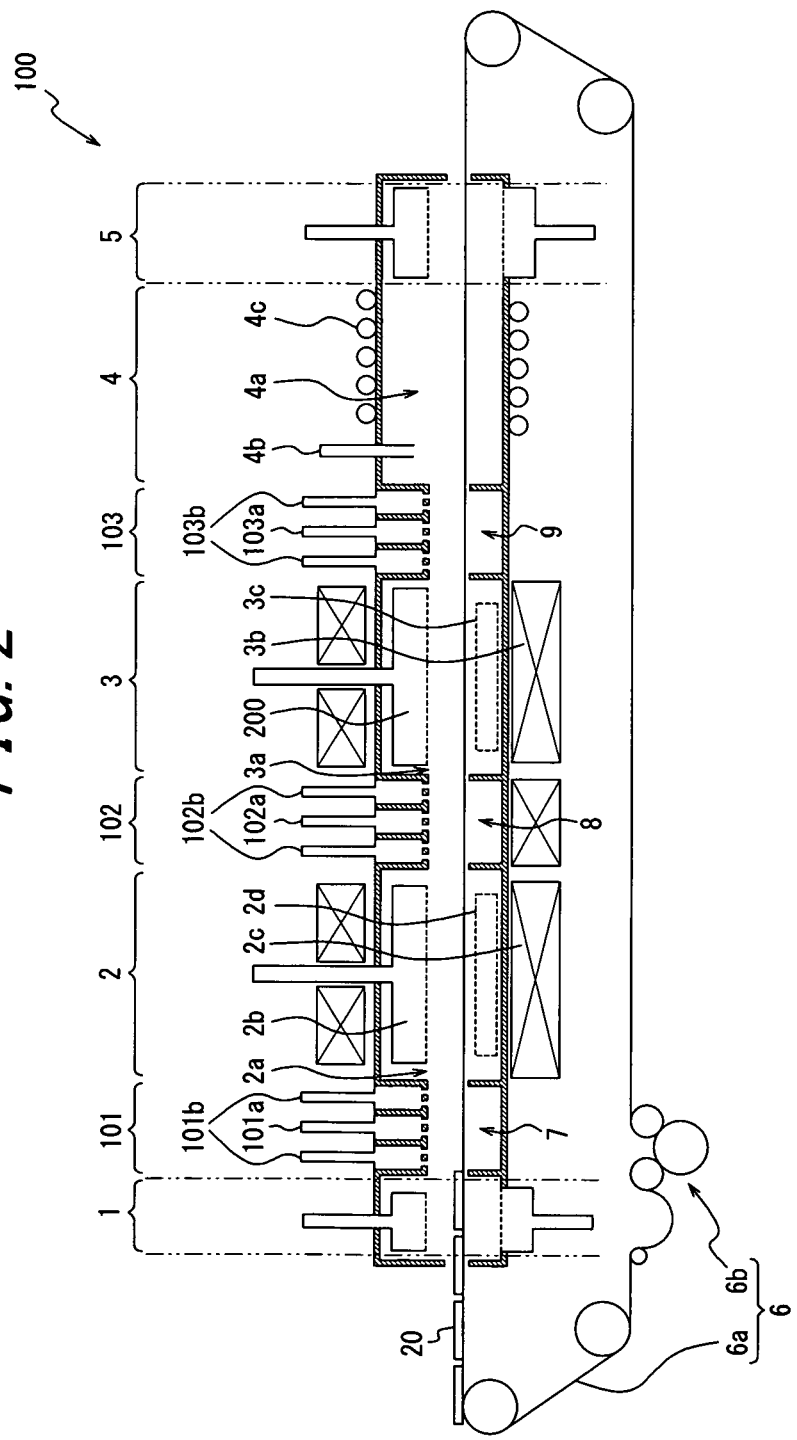
FIG. 2 schematically illustrates another example of a manufacturing apparatus used in the manufacturing method according to one embodiment.

In the following, a CNT manufacturing apparatus that includes a growth unit will be described with reference to FIG. 2. FIG. 2 schematically illustrates another example of a manufacturing apparatus used in the manufacturing method according to one embodiment. A CNT manufacturing apparatus 100 is an apparatus for carrying out a method of manufacturing CNTs.

The CNT manufacturing apparatus 100 includes an inlet purge section 1, a formation unit 2, gas mixing prevention means 101 to 103, a growth unit 3, a cooling unit 4, an outlet purge section 5, a transfer unit 6, and connection sections 7 to 9.

The formation unit 2 includes a formation furnace 2a, the growth unit 3 includes a growth furnace 3a, and the cooling unit 4 includes a cooling furnace 4a. The interior spaces of the formation furnace 2a, the growth furnace 3a, and the cooling furnace 4a are spatially connected by the connection sections 7 to 9.

(Inlet Purge Section)

The inlet purge section 1 is provided at the inlet of the CNT manufacturing apparatus 100. The inlet purge section 1 is a set of devices for preventing outside air from entering into the apparatus furnace through the inlet for the substrate 20. The inlet purge section 1 has the function of replacing, with a purge gas, the environment around the substrate 20 transferred into the apparatus. The substrate 20 has the same features as the above-described substrate 12 shown in FIG. 1.

The inlet purge section 1 has a gas curtain structure that ejects the purge gas from above and below in shower form. Outside air is thus prevented from entering into the CNT manufacturing apparatus 100 through the inlet. The inlet purge section 1 may, for example, be structured by a furnace or chamber for retaining the purge gas, an ejector for ejecting the purge gas, and the like.

The purge gas is preferably an inert gas. In particular, in terms of safety, cost, purging properties, and the like, the purge gas is preferably nitrogen.

When the inlet for the substrate 20 is always open, such as the case when the transfer unit 6 is a belt-conveyor type, as in this embodiment, then the inlet purge section 1 preferably has the above-mentioned gas curtain structure. With this structure, outside air can be prevented from entering into the CNT manufacturing apparatus 100 through the inlet for the substrate 20.

(Formation Unit)

The formation unit 2 is a set of devices for carrying out a formation step. The formation unit 2 has the function of causing the environment around the catalyst formed on the surface of the substrate 20 to become a reducing gas environment and of heating at least one of the catalyst and the reducing gas.

The formation unit 2 includes the formation furnace 2a for retaining the reducing gas, a reducing gas ejection section 2b for ejecting the reducing gas into the formation furnace 2a, a heater 2c for heating at least one of the catalyst and the reducing gas, and an exhaust hood 2d for discharging the gas within the formation furnace 2a.

A shower head provided with a plurality of nozzles may be used as the reducing gas ejection section 2b. The reducing gas ejection section 2b is disposed at a position that faces a catalyst formation surface of the substrate 20. A "position that faces" refers to a position such that an angle between the ejection axis line of each nozzle and a normal line to the substrate 20 is from 0° or more to less than 90°. Hence, the flow direction of gas ejected from the nozzles in the reducing gas ejection section 2b is substantially orthogonal to the substrate 20.

Using such a shower head for the reducing gas ejection section 2b allows for uniform scattering of the reducing gas over the substrate 20, thereby allowing for efficient reduction of the catalyst. As a result, uniformity of the CNTs grown on the substrate 20 can be improved, and the consumption of reducing gas can be decreased.

The heater 2c may be any type of heater that can heat at least one of the catalyst and the reducing gas. For example, the heater 2c may be a resistance heater, an infrared heater, an electromagnetic induction heater, or the like. The heating temperature is preferably in a range of 400° C. to 1100° C.

<Reducing Gas>

The reducing gas is a gas generally having at least one of the effects of reducing the catalyst, promoting atomization of the catalyst into fine particles (change into a state suitable for CNT growth), and improving the activity of the catalyst. The reducing gas may, for example, be hydrogen gas, ammonia, water vapor, or a gas that is a mixture thereof. A mixed gas containing a mixture of the above with an inert gas such as helium gas, argon gas, nitrogen gas, or the like may also be used. The reducing gas is generally used in the formation step but may be used in the growing step as appropriate.

<Formation Step>

The formation step is a step of causing an environment around the catalyst supported by the substrate 20 to become a reducing gas environment and of heating the catalyst and/or the reducing gas. This step brings about at least one of the effects of reducing the catalyst, promoting atomization of the catalyst into fine particles (change into a state suitable for CNT growth) and improving the activity of the catalyst.

The temperature of the catalyst and/or the reducing gas in the formation step is preferably 400° C. or more to 1100° C. or less. The duration time of the formation step is preferably 3 minutes or more to 30 minutes or less, and more preferably 3 minutes or more to 8 minutes or less. If the duration time of the formation step is within this range, the fine particles of the catalyst are prevented from coarsening, and the formation of multi-walled carbon nanotubes in the growing step can be suppressed.

For example, when using iron as the catalyst, a thin film of iron hydroxide or a thin film of iron oxide is formed, and simultaneously or subsequently the thin film is reduced and atomized to form fine particles of iron. When the material for the carburizing prevention layer is alumina and the catalyst metal is iron, the iron catalyst layer is reduced and atomized, and many nanometer-sized fine particles of iron form on the alumina layer. The catalyst can thus be adjusted to be suitable for CNT production.

(Growth Unit)

The growth unit 3 is a set of devices for carrying out the growing step. The growth unit 3 includes the growth furnace 3a for retaining an environment around the substrate 20 as a source gas environment, a source gas ejection section 200 for ejecting the source gas over the substrate 20, a heater 3b for heating at least one of the catalyst and the source gas, and an exhaust hood 3c for discharging the gas within the growth furnace 3a. The growth unit 3 may further include a catalyst activating material ejection section (not shown) for supplying a catalyst activating material and a cleaning gas ejection section (not shown) for supplying a cleaning gas. The source gas ejection section 200 may also serve as the catalyst activating material ejection section and/or the cleaning gas ejection section.

The growth furnace 3a is a furnace for performing the growing step, or specifically is a furnace for causing the environment around the catalyst on the substrate 20 to become the source gas environment and growing an aligned CNT aggregate on the substrate 20 by heating at least one of the catalyst and the source gas.

In the growing step, the source gas is preferably ejected from the source gas ejection section 200 over the substrate 20 being transferred through the growth furnace 3a.

The growth furnace 3a includes at least one or more source gas ejection sections 200 and at least one or more exhaust hoods 3c, and the total gas flow ejected from all of the source gas ejection sections 200 is preferably the same or approximately the same as the total gas flow discharged from all of the exhaust hoods 3c. This allows for prevention of the source gas to flow out of the growth furnace 3a and of the gas outside the growth furnace 3a to flow into the growth furnace 3a.

The heater 3b is preferably a type of heater capable of heating the catalyst and/or the source gas in a range of 400°

C. to 1100° C. For example, the heater 3b may be a resistance heater, an infrared heater, an electromagnetic induction heater, or the like.

The pressure within the growth furnace 3a set when growing an aligned CNT aggregate on the substrate 20 within the growth unit 3a is preferably $10^2$ Pa or more to $10^7$ Pa (100 atm) or less and more preferably $10^4$ Pa or more to $3 \times 10^5$ Pa (3 atm) or less.

The reaction temperature for growing CNTs within the growth furnace 3a is appropriately determined depending on the types and concentrations of the catalyst and the source gas, reaction pressure, and the like, yet reaction temperature is desirably set to a temperature range that allows for sufficient expression of the effects of the catalyst activating material to exclude secondary products that may cause catalyst deactivation. In other words, the most desirable temperature range is from a lower limit at which the catalyst activating material can remove secondary products, such as amorphous carbon and graphite, to an upper limit at which CNTs, which are primary products, are not oxidized by the catalyst activating material.

<Growing Step>

In the growing step, CNTs may be grown by causing the environment around the catalyst for growing CNTs to become the source gas environment, where CNT manufacturing can be enabled through for example the formation step and by heating at least one of the catalyst and the source gas. The details of the growing step have been described above.

<Cleaning Step>

The details of the cleaning step have been described above. Note that the manufacturing method preferably includes, after the growing step but before the cleaning step, a step of stopping the introduction of the substrates 20 into the growth furnace 3a and stopping the supply of the source gas into the growth furnace 3a. In this step, for example, introduction of the substrates 20 into the growth furnace 3a may be first stopped, and after all of the substrates 20 within the growth furnace 3a are carried out of the growth furnace 3a, the supply of the source gas may be stopped. The manufacturing method preferably further includes, before the growing step which is performed after the cleaning step, a step of starting the introduction of the substrates 20 into the growth furnace 3a and starting the supply of the source gas into the growth furnace 3a.

(Transfer Unit)

The transfer unit 6 is a set of devices necessary for introducing a plurality of substrates 20 consecutively into the CNT manufacturing apparatus 100. The transfer unit 6 includes a mesh belt 6a and a belt drive section 6b. The substrates 20 are transferred by the transfer unit 6 through each furnace space in the order of the formation unit 2, growth unit 3, and cooling unit 4.

The transfer unit 6 is a belt-conveyor type and transfers the substrates 20, which have catalyst formed on the surfaces thereof, from the interior space of the formation furnace 2a through the interior space of the growth furnace 3a into the interior space of the cooling furnace 4a. The transfer unit 6 for example transfers the substrate 20 with the mesh belt 6a driven by the belt drive section 6b using a reducer-equipped electric motor. In the CNT manufacturing apparatus 100, the interior space of the formation furnace 2a and the interior space of the growth furnace 3a are spatially connected by the connection section 8, and the interior space of the growth furnace 3a and the interior space of the cooling furnace 4a are spatially connected by the connection section 9. The mesh belt 6a on which the substrates 20 are mounted can thus pass through each furnace.

In the case that the CNT manufacturing apparatus 100 can manufacture CNTs consecutively and is provided with a transfer unit, the specific structure thereof is not limited to the above-described structure. For example, the transfer unit may be a robot arm, a robot arm driving device, and the like in a multi-chamber system.

(Connection Section)

Each of the connection sections 7 to 9 is a set of devices that spatially connect the furnace space of each unit and that serves to prevent the substrate 20 from being exposed to outside air when the substrate 20 is transferred from one unit to another. Examples of the connection sections 7 to 9 include a furnace or chamber capable of shielding the environment around the substrate from outside air and of passing the substrate 20 from one unit to another.

The inlet purge section 1 and the formation unit 2 are spatially connected by the connection section 7. The connection section 7 is provided with the gas mixing prevention means 101, and a mixed gas including the purge gas ejected in the inlet purge section 1 and the reducing gas ejected from the reducing gas ejection section 2b is discharged. In this way, the purge gas is prevented from entering into the interior space of the formation furnace 2a, and the reducing gas is prevented from entering into the inlet purge section 1 side.

The formation unit 2 and the growth unit 3 are spatially connected by the connection section 8. The connection section 8 is provided with the gas mixing prevention means 102, and the reducing gas in the interior space of the formation furnace 2a is discharged along with the source gas and the catalyst activating material in the interior space of the growth furnace 3a. In this way, the source gas or the catalyst activating material are prevented from entering into the interior space of the formation furnace 2a, and the reducing gas is prevented from entering into the interior space of the growth furnace 3a.

The growth unit 3 and the cooling unit 4 are spatially connected by the connection section 9. The connection section 9 is provided with the gas mixing prevention means 103, and a mixed gas including the source gas and the catalyst activating material in the interior space of the growth furnace 3a and the inert gas in the interior space of the cooling furnace 4a is discharged. In this way, the source gas or the catalyst activating material are prevented from entering into the interior space of the cooling furnace 4a, and the inert gas is prevented from entering into the interior space of the growth furnace 3a.

The CNT manufacturing apparatus 100 may further include heating means for heating the connection section 9 between the growth unit 3 and the cooling unit 4. If the temperature near the outlet of the growth furnace 3a reduces, a degradation product of the source gas may become amorphous carbon and deposit on the top of the CNTs. As a result, the G/D ratio at the top of the CNTs growing perpendicularly from the substrate may become lower than the G/D ratio at the bottom.

Heating the connection section 9 between the growth unit 3 and the cooling unit 4, however, reduces the difference between the G/D ratio at the top and the G/D ratio at the bottom. It thus becomes possible to achieve CNTs with stable quality.

A specific configuration of the heating means for heating the connection section 9 may, for example, be means for heating a seal gas ejected in the gas mixing prevention means 103 between the growth unit 3 and the cooling unit 4. Heating the seal gas makes it possible to heat the outlet of the growth furnace 3a and the area around the outlet.

(Gas Mixing Prevention Means)

Each of the gas mixing prevention means 101 to 103 is a set of devices for implementing the function of preventing the gases located in the furnace space of each unit from mixing with each other. The gas mixing prevention means 101 to 103 are provided, respectively, in the connection sections 7 to 9 that spatially connect the furnace space of each unit. The gas mixing prevention means 101 to 103 each include one or more seal gas ejection sections 101b to 103b that eject the seal gas along the aperture planes of the inlet and the outlet for the substrate 20 in each furnace, and one or more exhaust sections 101a to 103a that adsorb mainly the ejected seal gas (and other gases in the around area) so as to prevent them from entering into the furnaces and discharge them outside the apparatus.

By being ejected along the aperture planes of the furnaces, the seal gas blocks the inlet and outlet of the furnaces and can prevent gas outside the furnaces from entering into the furnaces. Also, discharging the seal gas outside the manufacturing apparatus can prevent the seal gas from entering into the furnaces.

The seal gas is preferably an inert gas. In particular, in terms of safety, cost, and the like, the seal gas is preferably nitrogen. The arrangement of the seal gas ejection section(s) 101b to 103b and the exhaust section(s) 101a to 103a, when each number thereof is one, may be such that one exhaust section is placed next to one seal gas ejection section, or such that one exhaust section is placed to face one seal gas ejection section with the mesh belt 6a therebetween. The seal gas ejection section(s) 101b to 103b and the exhaust section(s) 101a to 103a are preferably arranged so that the overall structure of the gas mixing prevention means 101 to 103 is symmetrical in the furnace length direction.

For example, two seal gas ejection sections may be provided on each side of one exhaust section for a structure that, centering on the exhaust section, is symmetrical in the furnace length direction. The total gas flow ejected from the seal gas ejection section(s) 101b to 103b is preferably approximately the same as the total gas flow discharged from the exhaust section(s) 101a to 103a. Gas from the space on either side of the gas mixing prevention means 101 to 103 can thus be prevented from mixing together, and the seal gas can also be prevented from flowing into the space on either side. By providing the gas mixing prevention means 101 to 103 at both ends of the growth furnace 3a, the flow of seal gas and the flow of gas within the growth furnace 3a can be prevented from interfering with each other. It is also possible to prevent a disturbance in gas flow due to seal gas flowing into the growth furnace 3a. Hence, a suitable apparatus for continuous manufacturing of CNTs can be achieved.

The level of gas mixture prevented by the gas mixing prevention means 101 to 103 is preferably a level that does not inhibit the manufacture of an aligned CNT aggregate. In particular, the gas mixing prevention means preferably has a function to maintain the number concentration of carbon atoms in the reducing gas environment inside the formation furnace 2a at $5\times10^{22}$ atoms/m$^3$ or less, more preferably $1\times10^{22}$ atoms/m$^3$ or less.

The exhaust amount Q of each of the exhaust sections 101a to 103a cannot be independently determined from one another. The exhaust amount needs to be adjusted in accordance with the amount of the gases supplied to the entire apparatus (the reducing gas flow, source gas flow, cooling gas flow, and the like). A necessary condition for satisfying gas mixing prevention can, however, be represented by the following condition.

$$Q \geq 4DS/L$$

where D is the diffusion coefficient of a gas to be prevented from entering, S is the sectional area of a boundary at which the gas is prevented from entering, and L is the length of the exhaust section (in the furnace length direction). The exhaust amount of each of the exhaust sections 101a to 103a is set so that this condition is satisfied and so that a balance between gas supply and exhaust in the entire apparatus is maintained.

<Number Concentration of Carbon Atoms>

Entering of the source gas into the interior space of the formation furnace 2a exerts a harmful influence on the growth of the CNTs. Thus, entering of the source gas into the formation furnace 2a is preferably prevented by the gas mixing prevention means 101 and 102 such that the number concentration of carbon atoms in the reducing gas environment inside the formation furnace 2a is maintained at $5\times10^{22}$ atoms/m$^3$ or less, more preferably $1\times10^{22}$ atoms/m$^3$ or less. The number concentration of carbon atoms is calculated according to the following condition, where with respect to the types of gas contained in the reducing gas environment (i=1, 2, . . . ), the concentration (ppmv) is denoted by $D_1$, $D_2$, . . . , the density in standard condition (g/m$^3$) is denoted by $\rho_1$, $\rho_2$, . . . , the molecular weight is denoted by $M_1$, $M_2$, . . . , the number of carbon atoms contained in each gas molecule is denoted by $C_1$, $C_2$, . . . , and Avogadro's number is denoted by $N_A$.

$$\text{(Number concentration of carbon atoms)} = \sum_i C_i \frac{\rho_i D_i}{M_i} N_A$$

The production quantity and quality of the CNTs can be maintained high by keeping the number concentration of carbon atoms in the reducing gas environment inside the formation furnace 2a at $5\times10^{22}$ atoms/m$^3$ or less. That is, setting the number concentration of carbon atoms to $5\times10^{22}$ atoms/m$^3$ or less makes it possible, in the formation step, to highly exhibit the effects of, for example, reducing the catalyst, promoting atomization of the catalyst into fine particles, and improving the activity of the catalyst, and also to maintain a high production quantity and quality of the CNTs during the growing step.

The gas mixing prevention means 101 to 103 is not limited to the structure in this embodiment and may, for example, be a gate valve device that mechanically shuts off the spatial connection between units at all times other than when the substrate 20 is being transferred from one unit to another. The gas mixing prevention means 101 to 103 may also be a gas curtain device that shuts off the spatial connection between units by inert gas ejection.

In order to reliably prevent gas mixing, a combination of an exhaust device with a gate valve device and/or gas curtain is preferably used. However, from the perspective of efficient continuous CNT growth by transferring the substrate from one unit to another without interruption and from the perspective of simplifying the manufacturing apparatus, the exhaust device is more preferably used alone.

(Cooling Unit)

The cooling unit 4 is a set of devices for carrying out the cooling step, or specifically for cooling the substrate 20 on which the CNTs have grown. The cooling unit 4 has a function to cool the CNTs and the substrate 20 after the growing step.

The cooling unit 4 has a configuration combining a water cooling system with an air cooling system and is formed by the cooling furnace 4a for retaining an inert gas, a coolant gas ejection section 4b that ejects the inert gas into the cooling furnace 4a, and a water-cooled cooling tube 4c disposed to surround the internal space of the cooling furnace 4a. The cooling unit 4 may be configured as only a water cooling system or only an air cooling system.

The cooling in the cooling unit 4 can prevent oxidation of the CNTs, the catalyst, and the substrate 20 after the growing step.

<Cooling Step>

The cooling step is a step of cooling the CNTs, the catalyst, and the substrate, after the growing step, in the presence of an inert gas. After the growing step, the CNTs, the catalyst, and the substrate are at a high temperature, and therefore may oxidize upon being placed in the presence of oxygen. This is prevented by cooling the CNTs, the catalyst, and the substrate in the cooling step in the presence of an inert gas. The temperature during the cooling step is 400° C. or less, more preferably 200° C. or less.

(Outlet Purge Section)

An outlet purge section 5, which has nearly the same structure as the inlet purge section 1, is provided at the outlet of the CNT manufacturing apparatus 100. The outlet purge section 5 is a set of devices for preventing outside air from entering into the CNT manufacturing apparatus 100 through the outlet for the substrate 20. The outlet purge section 5 has the function of changing the environment around the substrate 20 into a purge gas environment.

The outlet purge section 5 prevents outside air from entering into the cooling furnace 4a through the outlet by ejecting purge gas from above and below in shower form. The outlet purge section 5 may be structured by a furnace or chamber for retaining the purge gas environment, an ejector for ejecting the purge gas, and the like.

The purge gas is preferably an inert gas. In particular, in terms of safety, cost, purging properties, and the like, the purge gas is preferably nitrogen.

When the outlet for the substrate 20 is always open, such as the case when the transfer unit 6 is a belt-conveyor type, then the outlet purge section 5 preferably has a gas curtain structure such as the one described above. This structure allows for prevention of outside air from entering into the CNT manufacturing apparatus 100 through the outlet for the substrate 20.

<Materials for Apparatus Components Exposed to Reducing Gas or Source Gas>

The apparatus components exposed to the reducing gas or the source gas include a portion of the formation unit 2, the growth unit 3, the transfer unit 6, the gas mixing prevention means 101 to 103, and the connection sections 7 to 9. More specifically, examples of the apparatus components exposed to the reducing gas or the source gas include the formation furnace 2a, the reducing gas ejection section 2b, the growth furnace 3a, the source gas ejection section 200, the mesh belt 6a, the exhaust sections 101a to 103a, the seal gas ejection sections 101b to 103b, furnaces of the connection sections 7 to 9, and the like.

The material for the apparatus components exposed to the reducing gas or the source gas may be a material that can withstand high temperatures, such as quartz, heat-resistant ceramic, metal, and the like. In terms of processing precision, degree of freedom of processing, cost, and the like, metal is preferable. Heat-resistant alloys and the like are examples of metal. Examples of heat-resistant alloys include heat-resistant steel, stainless steel, and nickel-based alloys. In general, heat-resistant steel refers to steel that contains Fe as the principal component and other alloys in concentrations of 50 mass % or less. Stainless steel generally refers to steel that contains Fe as the principal component, other alloys in concentrations of 50 mass % or less, and approximately 12 mass % or more of Cr. Furthermore, examples of nickel-based alloys include alloys obtained by adding Mo, Cr, Fe, and the like to Ni. Specifically, SUS 310, Inconel 600, Inconel 601, Inconel 625, Incoloy 800, MC Alloy, Haynes 230 Alloy, and the like are preferable in terms of heat resistance, mechanical strength, chemical stability, low cost, and other such considerations.

When forming the furnace inner wall and/or components used in the furnace from metal, the material is preferably a heat-resistant alloy, and the surface is preferably plated with molten aluminum or polished so that the surface has an arithmetic average roughness Ra≤2 μm. This structure makes it possible to reduce the carbon contaminants that adhere to the wall surface when growing CNTs in a high-carbon environment. A decrease in production quantity and a deterioration in quality of CNTs can thus be prevented, making this structure appropriate.

<Molten Aluminum Plating>

Molten aluminum plating refers to a process of forming an aluminum or aluminum alloy layer on the surface of an object by dipping the object into a bath of molten aluminum. The following is an example of how to carry out this process. The surface of an object (base metal) is washed (preprocessed), and then the object is dipped into a bath of molten aluminum at approximately 700° C., thereby causing the molten aluminum to disperse into the surface of the base metal so as to form an alloy of the base metal and aluminum. Aluminum is thus adhered to the alloy layer when the base metal is withdrawn from the bath. Furthermore, a process may then be performed to subject the alumina layer and aluminum layer in the surface layer to low-temperature thermal diffusion, thereby exposing the Fe—Al alloy layer below.

<Polishing>

Examples of a method of polishing the heat-resistant alloy so that the arithmetic average roughness Ra≤2 μm include mechanical polishing as typified by buffing, chemical polishing that involves the use of a chemical, electrolytic polishing that is carried out while passing an electric current through an electrolyte, and complex electrolytic polishing that is a combination of mechanical polishing and electrolytic polishing.

<Arithmetic Average Roughness>

For the definition of arithmetic average roughness Ra, refer to JIS B0601:2001.

As described above, in the CNT manufacturing apparatus 100, the disclosed manufacturing method allows substrate 20 that has catalyst on the surface thereof to be continuously transferred by the transfer unit 6, and to consecutively pass through the inlet purge section 1, formation unit 2, growth unit 3, cooling unit 4, and outlet purge section 5. During that time, the catalyst is reduced in a reducing gas environment in the formation unit 2, CNTs grow on the surface of the substrate in a source gas environment in the growth unit 3, and the resultant is cooled in the cooling unit 4.

Preferred embodiments have been described, yet the disclosure is not limited to the above embodiments, and a variety of modifications and changes may be made within the scope of the features.

For example, by appropriately setting the reaction conditions, such as the source gas, heating temperature, and the like, single-walled or multi-walled CNTs may be selectively manufactured, and it is also possible to manufacture a mixture of both.

In the above embodiments, the catalyst has been described as being formed on the substrate surface by a film formation device separated from the manufacturing apparatus. The manufacturing apparatus may be structured, however, to include a catalyst film formation unit upstream from the formation unit 2, with the substrate passing through the catalyst film formation unit before entering the formation unit 2.

In the above embodiment, the units are disposed in the order of the formation unit 2, growth unit 3, and cooling unit 4, and the furnace spaces are spatially connected by the connection sections 7 to 9. However, a plurality of units that carry out steps other than the formation step, growing step, and cooling step may be added at some position, and the furnace spaces of the units may be spatially connected by connection sections.

In the above embodiment, the formation unit 2, growth unit 3, and cooling unit 4 have been described as being arranged linearly. The arrangement of the units is not, however, limiting. These units may, for example, be in a circular configuration.

Furthermore, a suitable configuration for continuously manufacturing CNTs has been mainly described in which the formation unit 2 and growth unit 3 are provided separately, and substrates 20 are continuously introduced into these units, yet the CNT manufacturing apparatus used herein is not limited to this configuration.

The method disclosed herein is not limited to the above embodiments, and a variety of modifications may be made within the scope of the claims. Other embodiments yielded by appropriately combining the technical means described in different embodiments are also included in the technical scope of the method disclosed herein.

EXAMPLES

An Example of the disclosure will be described with reference to FIGS. 3 to 9. However, the Example is in no way limiting.

The growth furnace used in Reference Examples 1 and 2 below is made of quartz, and the growth furnace used in the Example of the disclosure is made of a material obtained by plating the surface of SUS 310 with molten aluminum.

Reference Example 1

Cleaning of a Sample of Normally-Carburized Growth Furnace

In a batch-type growth furnace shown in FIG. 1, cleaning of a sample piece (4.5 cm×13 cm×0.25 mm) was performed, and the concentrations of gases (hydrogen, carbon monoxide, and carbon dioxide) in the furnace at that time were measured. The sample piece being cleaned was a piece of material obtained by coating the surface of SUS 310, which is a base material, with molten aluminum plating and by carburizing the piece for 60 hours in the below-described CNT manufacturing apparatus under the same conditions as those set for manufacturing the aligned CNT aggregate described below (furnace temperature: 830° C.; source gas: nitrogen 16040 sccm, ethylene 1800 sccm, water vapor-containing nitrogen 160 sccm (relative humidity: 22.3%)).

In cleaning the sample piece, cleaning conditions were set as shown in Table 1 below.

TABLE 1

| | Gas flow [sccm] Composition | Setting temperature [° C.] |
|---|---|---|
| Cleaning conditions | 833 $H_2O$: 5000-12000 ppm $N_2$: remainder | 800-950 |

Figure 3:
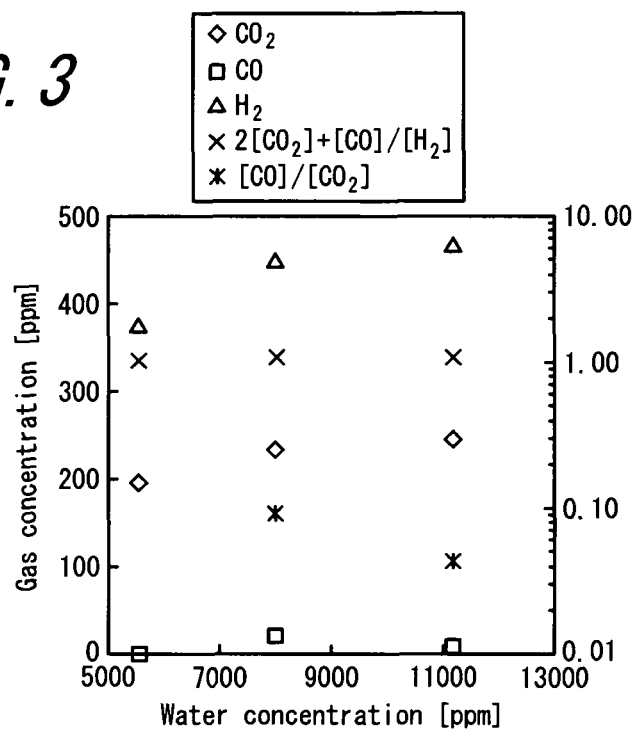
FIG. 3 is a graph showing the relationship between water concentration and gas concentration in a cleaning step of Reference Example 1.

The relationship between the water concentration and each gas concentration five minutes after starting the cleaning is shown in FIG. 3. Each gas concentration shown in the graph of FIG. 3 is specified in Table 2 below (gas concentration: ppmv).

TABLE 2

| $H_2O$ | $CO_2$ | CO | $H_2$ | $(2[CO_2] + [CO])/[H_2]$ | $[CO]/[CO_2]$ |
|---|---|---|---|---|---|
| 5534 | 196 | 0 | 375 | 1.04 | 0.00 |
| 7992 | 233 | 22 | 449 | 1.08 | 0.09 |
| 11153 | 246 | 11 | 467 | 1.07 | 0.04 |

Figure 4:
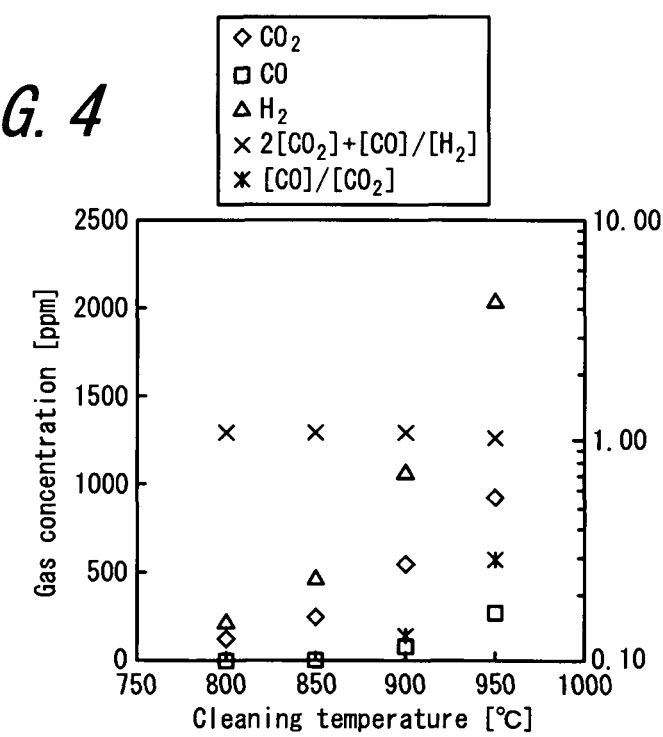
FIG. 4 is a graph showing the relationship between cleaning temperature and the gas concentration in the cleaning step of Reference Example 1.

The relationship between the temperature within the furnace and each gas concentration five minutes after starting the cleaning is shown in FIG. 4. Each gas concentration shown in the graph of FIG. 4 is specified in Table 3 below (temperature: ° C., gas concentration: ppmv).

TABLE 3

| Temperature | $CO_2$ | CO | $H_2$ | $(2[CO_2] + [CO])/[H_2]$ | $[CO]/[CO_2]$ |
|---|---|---|---|---|---|
| 800 | 117 | 0 | 223 | 1.05 | 0.00 |
| 850 | 246 | 11 | 467 | 1.07 | 0.04 |
| 900 | 544 | 69 | 1075 | 1.08 | 0.13 |
| 950 | 921 | 265 | 2041 | 1.03 | 0.29 |

FIG. 3 and Table 2 show that in a range of water concentration of 5000 to 12000 ppmv, hydrogen and carbon dioxide were generated in a relatively large amount, with a tendency of the concentrations thereof to be proportional to the water concentration. This demonstrates that the water concentration and the cleaning rate are proportional to each other. In the meantime, the amount of carbon monoxide generated was extremely small.

FIG. 4 and Table 3 show that in a temperature range of 800° C. to 950° C., hydrogen and carbon dioxide were generated in a relatively large amount, with a tendency to be proportional to the temperature. This demonstrates that the temperature and the cleaning rate are proportional to each other. Carbon monoxide also had a tendency to increase in proportion to the temperature, yet the yield was also small.

The above results demonstrate that for both of the water concentration and the temperature, the value of $(2[CO_2]+[CO])/[H_2]$ was maintained at approximately 1 over each of the entire ranges, and that it was monitored that the inside of the growth furnace was hardly oxidized during the cleaning. Further, the value of $[CO]/[CO_2]$ was maintained at 1 or less over each of the entire ranges, which demonstrates that the cleaning of the inside of the carburized growth furnace caused less amount of carbon monoxide to be generated than carbon dioxide, irrespective of the cleaning conditions.

Reference Example 2

Cleaning of Carbon Contaminants Fallen Off an Excessively-Carburized Growth Furnace In a batch-type growth furnace shown in FIG. 1, cleaning of a carbon-contaminant sample (0.45 g) was performed, and the concentrations of the gases (hydrogen, carbon monoxide, and carbon dioxide) in the furnace at that time were measured. The carbon-contaminant sample was collected from inside the CNT manufacturing apparatus after the preparation of the sample piece used in Reference Example 1, and the growth furnace is made of a material obtained by plating the surface of SUS 310 with molten aluminum. The carbon-contaminant sample contains a metal component derived from the furnace wall.

In cleaning the carbon-contaminant sample, cleaning conditions were set as shown in Table 4 below.

TABLE 4

|  | Gas flow [sccm] Composition | Setting temperature [° C.] |
|---|---|---|
| Cleaning conditions | 833 $H_2O$: 5000-12000 ppm $N_2$: remainder | 750-950 |

Figure 5:
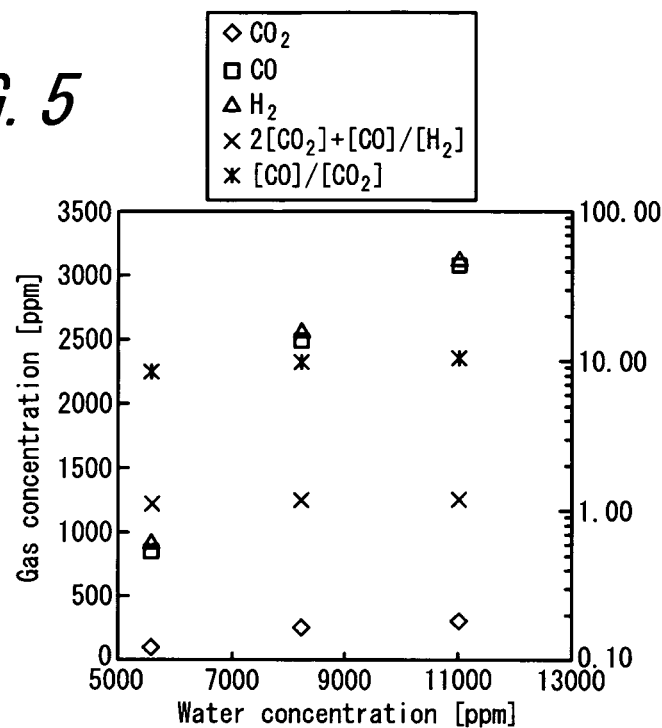
FIG. 5 is a graph showing the relationship between water concentration and gas concentration in a cleaning step of Reference Example 2.

The relationship between the water concentration and each gas concentration five minutes after starting the cleaning is shown in FIG. 5. Each gas concentration shown in the graph of FIG. 5 is specified in Table 5 below (gas concentration: ppmv).

TABLE 5

| $H_2O$ | $CO_2$ | CO | $H_2$ | $(2[CO_2] + [CO])/[H_2]$ | $[CO]/[CO_2]$ |
|---|---|---|---|---|---|
| 5577 | 99 | 841 | 925 | 1.12 | 8.54 |
| 8212 | 252 | 2477 | 2558 | 1.17 | 9.83 |
| 10993 | 295 | 3065 | 3111 | 1.18 | 10.38 |

Figure 6:
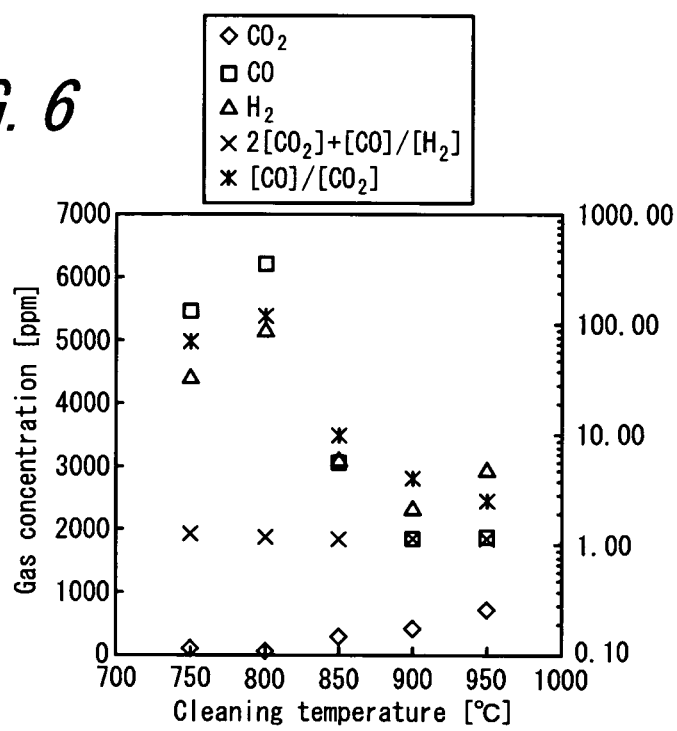
FIG. 6 is a graph showing the relationship between cleaning temperature and the gas concentration in the cleaning step of Reference Example 2.

The relationship between the temperature within the furnace and each gas concentration five minutes after starting the cleaning is shown in FIG. 6. Each gas concentration shown in the graph of FIG. 6 is specified in Table 6 below (temperature: ° C., gas concentration: ppmv).

TABLE 6

| Temperature | $CO_2$ | CO | $H_2$ | $(2[CO_2] + [CO])/[H_2]$ | $[CO]/[CO_2]$ |
|---|---|---|---|---|---|
| 750 | 78 | 5392 | 4397 | 1.26 | 68.95 |
| 800 | 51 | 6170 | 5205 | 1.20 | 121.6 |
| 850 | 295 | 3065 | 3111 | 1.18 | 10.4 |
| 900 | 430 | 1807 | 2354 | 1.13 | 4.2 |
| 950 | 718 | 1845 | 2966 | 1.11 | 2.6 |

FIG. 5 and Table 5 show that in a range of water concentration of 5000 to 12000 ppmv, hydrogen and carbon monoxide were generated in a relatively large amount, with a tendency of the concentrations thereof to be proportional to the water concentration. This demonstrates that the water concentration and the cleaning rate are proportional to each other. In the meantime, the amount of carbon dioxide generated was relatively small.

FIG. 6 and Table 6 show that in a temperature range of 750° C. to 950° C., hydrogen and carbon monoxide were generated in a relatively large amount, with a tendency to reach an extreme value around 800° C. This demonstrates that the cleaning rate is fastest around 800° C. Although carbon dioxide had a tendency to increase in proportion to the temperature, the yield was relatively small.

The above results demonstrate that for both of the water concentration and the temperature, the value of $(2[CO_2]+[CO])/[H_2]$ was maintained at approximately 1 over each the entire ranges, and that it was monitored that the metal components contained in the carbon contaminants was hardly oxidized during the cleaning. Further, the value of $[CO]/[CO_2]$ was maintained at 1 or more over each of the entire ranges, which demonstrates that the cleaning of the carbon contaminants caused more amount of carbon monoxide to be generated than carbon dioxide, irrespective of the cleaning conditions.

The Reference Examples 1 and 2 demonstrated that the concentration ratio of carbon monoxide to carbon dioxide varies in accordance with the carburizing status of the inside of the growth furnace, irrespective of the cleaning conditions. When the carburizing status was at a level at which peeling of carbon contaminants off the inner surface of the growth furnace does not occur (normal carburizing), $[CO]/[CO_2]$ was 1 or less. On the other hand, when the carburizing status was at a level at which peeling of carbon contaminants occurs (excess carburizing state), the value of $[CO]/[CO_2]$ increased to exceed 10. It has been demonstrated that by monitoring the concentrations of carbon monoxide and carbon dioxide during cleaning and adjusting the cleaning starting time and ending time such that $[CO]/[CO_2] \leq 10$ can be satisfied, excess carburizing of the inside of the growth furnace can be prevented.

Example

Using the CNT manufacturing apparatus shown in FIG. 2, the manufacturing steps that include the formation step and the growing step were consecutively performed to manufacture an aligned CNT aggregate, and then the cleaning step was performed.

To manufacture an aligned CNT aggregate, substrates having thereon a catalyst formed as described below are consecutively mounted on the mesh belt of the CNT manufacturing apparatus, and maintaining a constant transfer rate of the mesh belt, an aligned CNT aggregate was manufactured on the substrates.

(Substrate)

A flat plate of Fe—Cr alloy SUS 430 (produced by JFE Steel Corporation, Cr: 18 mass %) measuring 500 mm wide by 500 mm tall and 0.3 mm thick was prepared as a flat base plate used as the substrate. Using a laser microscope, the surface roughness at several locations on the base plate was measured, yielding an arithmetic average roughness Ra of approximately 0.063 μm.

(Catalyst Formation)

On the above-described base plate, a catalyst was formed in the following manner. A coating agent for alumina film formation was produced by dissolving 1.9 g of aluminum tri-sec-butoxide into 100 mL (78 g) of 2-propanol and then adding and dissolving 0.9 g of triisopropanolamine as a stabilizer. In an environment of a room temperature of 25° C. and a relative humidity of 50%, the coating agent for alumina film formation was applied onto the base plate by dip coating. The following application conditions were employed: The application was made by dipping the base plate into the coating agent for alumina film formation, leaving the base plate there for 20 sec, and removing the base plate at a removal speed of 10 mm/sec. Subsequently, the base plate was air dried for 5 min. Next, the base plate was heated for 30 min in an air environment of 300° C. and then cooled to room temperature. An alumina film with a thickness of 40 nm was thus formed on the base plate.

Subsequently, an iron film coating agent was produced by dissolving 174 mg of iron acetate in 100 mL of 2-propanol and then adding and dissolving 190 mg of triisopropanolamine as a stabilizer. In an environment of room temperature of 25° C. and a relative humidity of 50%, the iron film coating agent was applied, by dip coating, onto the base plate on which the alumina film had been formed. The following application conditions were employed: The application was made by dipping the base plate into the iron film coating agent, leaving the base plate there for 20 sec, and removing the base plate at a removal speed of 3 mm/sec. Subsequently, the base plate was air dried for 5 min. Next, the base plate was heated for 30 min in an air environment of 100° C. After the heating, the base plate was cooled to room temperature to obtain a base plate on which an iron film having a thickness of 3 nm was formed on the flat base plate.

(Manufacturing Conditions)

Conditions of each component of the CNT manufacturing apparatus at the time of CNT manufacture were set as shown in Table 7 below. In Table 7, an empty cell indicates that no setting was made.

TABLE 7

| | Gas flow [sLm] Composition | Setting temperature [° C.] | Processing time [min] | Exhaust amount [sLm] |
|---|---|---|---|---|
| Inlet purge section | 300 N$_2$: 100% | | | |
| Gas mixing prevention means | 100 N$_2$: 100% | | | 100 |
| Formation unit | 140 H$_2$: 60% N$_2$: 40% | 822 | 28 | 140 |
| Gas mixing prevention means | 125 N$_2$: 100% | | | 125 |
| Growth unit | 150 C$_2$H$_4$: 10% H$_2$O: 55-440 ppm N$_2$: remainder | 817 | 11 | 150 |
| Gas mixing prevention means | 100 N$_2$: 100% | | | 100 |
| Cooling unit | 50 N$_2$: 100% | | 30 | |
| Outlet purge section | 250 N$_2$: 100% | | | |

During the growing step, the added amount of catalyst activating material was adjusted. In the growing step, the atmosphere near the substrate during CNT manufacture was sampled, and a water amount to be added as a catalyst activating material was adjusted such that the concentration of each of hydrogen, methane, and ethane is maximized.

At intervals of an integrated manufacturing time of approximately 5 to 6 hours, a gas that contains water was introduced into the growth furnace into which the substrate had not been introduced to perform gas measurement of the inside of the growth furnace. The timing at which the cleaning is started was adjusted such that the cleaning can be started before the concentration ratio of carbon monoxide to carbon dioxide ([CO]/[CO$_2$]) reaches 10.

(Cleaning Step)

The conditions for each component of the CNT manufacturing apparatus in the cleaning step were nearly the same as those set for CNT manufacturing except for the conditions for the growth unit 3, which were altered as shown in Table 8 below.

TABLE 8

| | Gas flow [sLm] Composition | Setting temperature [° C.] | Exhaust amount [sLm] |
|---|---|---|---|
| Growth unit | 150 H$_2$O: 1.5-2.0% N$_2$: remainder | 817-967 | 150 |

The gas concentrations (of hydrogen, carbon monoxide, carbon dioxide) within the growth furnace during the cleaning were monitored, and based on the results, the water amount introduced as a cleaning gas and setting temperature were adjusted within the above-described range such that the concentration of hydrogen is maximized and that the value of (2[CO$_2$]+[CO])/[H$_2$] does not fall below 0.7. The cleaning was then ended before the value of (2[CO$_2$]+[CO])/[H$_2$] falls below 0.7.

Figure 7:
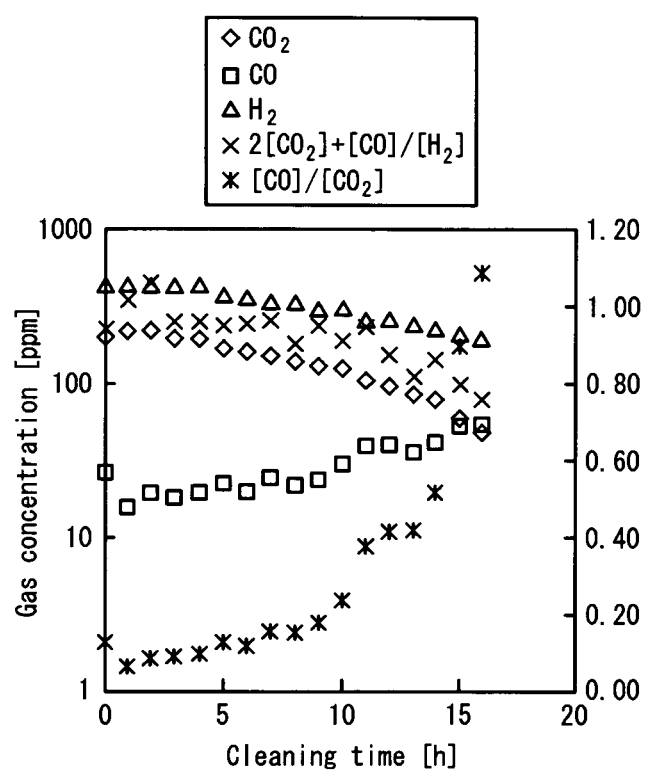
FIG. 7 is a graph showing the relationship between cleaning time and the gas concentration in a cleaning step of Example.

The CNT manufacturing and the cleaning step were repeated under the above-described conditions. The results of monitoring of the concentrations of hydrogen, carbon monoxide, and carbon dioxide obtained for the fourth cleaning step are shown in FIG. 7. Each gas concentration shown in the graph of FIG. 7 is specified in Table 9 below (cleaning time: hour (h), gas concentration: ppmv). The water amount in the cleaning gas then was 1.5 vol %, and the setting temperature of the growth unit was 867° C.

TABLE 9

| Hour | H$_2$ | CO | CO$_2$ | (2[CO$_2$] + [CO])/[H$_2$] | [CO]/[CO$_2$] |
|---|---|---|---|---|---|
| 0.1 | 439 | 25.8 | 192.9 | 0.94 | 0.13 |
| 1 | 435 | 15.2 | 213.8 | 1.02 | 0.07 |
| 2 | 423 | 18.8 | 214.7 | 1.06 | 0.09 |
| 3 | 420 | 17.4 | 192.4 | 0.96 | 0.09 |
| 4 | 418 | 18.6 | 191.2 | 0.96 | 0.10 |
| 5 | 373 | 21.7 | 166.1 | 0.95 | 0.13 |
| 6 | 357 | 19.4 | 160.7 | 0.95 | 0.12 |
| 7 | 337 | 23.8 | 150.3 | 0.96 | 0.16 |
| 8 | 333 | 21.4 | 139.3 | 0.90 | 0.15 |
| 9 | 298 | 23.1 | 129.2 | 0.95 | 0.18 |
| 10 | 299 | 28.4 | 121.7 | 0.91 | 0.23 |
| 11 | 255 | 38.1 | 101.5 | 0.95 | 0.38 |
| 12 | 257 | 38.6 | 93.1 | 0.87 | 0.41 |
| 13 | 245 | 34.7 | 83 | 0.82 | 0.42 |
| 14 | 226 | 40.3 | 77.5 | 0.86 | 0.52 |
| 15 | 213 | 52.9 | 58.8 | 0.80 | 0.90 |
| 16 | 197 | 52.5 | 48.4 | 0.76 | 1.08 |

The cleaning was performed such that the value of (2[CO$_2$]+[CO])/[H$_2$] falls within a range of 0.7 or more to 1.3 or less and such that the value of [CO]/[CO$_2$] falls to 10 or less in all the cleaning steps repeatedly performed.

Figure 8:
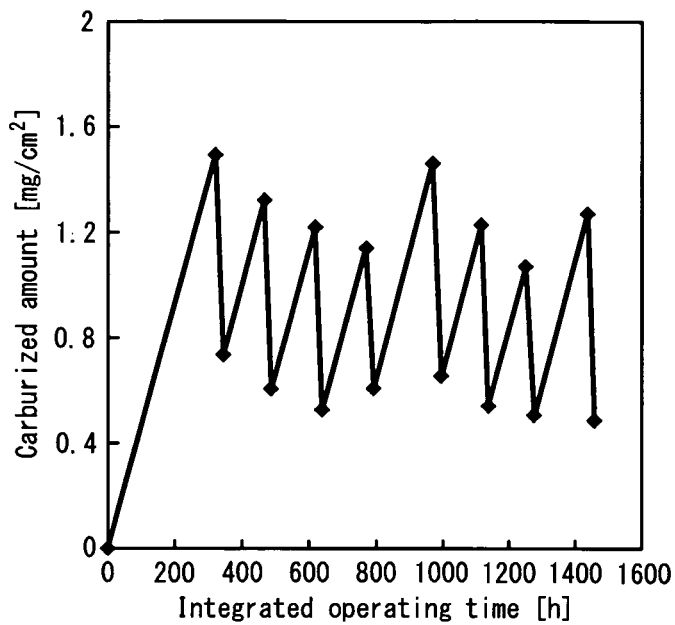
FIG. 8 is a graph showing the relationship between integrated operating time and carburized amount inside a growth furnace of the manufacturing apparatus used in the Example.

To confirm the cleaning effects, the carburized amount (weight increased by carburizing) of a portion of the source gas ejection section (one shower nozzle) of the growth unit was measured before and after every cleaning step, and appearance check was performed visually. The variation of the carburized amount was shown in FIG. 8. The carburized amount was shown by increased weight to surface area (increased weight/surface area). The carburized amounts shown in the graph of FIG. 8 are specified in Table 10 below (carburized amount: mg/cm$^2$, integrated operating time: hour (h)).

TABLE 10

| Integrated operating time | Carburized amount |
|---|---|
| 0 | 0.000 |
| 324 | 1.499 |
| 345 | 0.750 |
| 471 | 1.331 |
| 489 | 0.612 |
| 623 | 1.231 |
| 643 | 0.551 |
| 722 | 1.147 |
| 788 | 0.619 |
| 974 | 1.476 |
| 995 | 0.673 |
| 1117 | 1.239 |
| 1141 | 0.558 |
| 1255 | 1.086 |
| 1278 | 0.528 |
| 1442 | 1.285 |
| 1460 | 0.497 |

The carburized amount of the shower nozzle fell within a range of approximately 0.4 to 1.6 mg/cm$^2$, and the inclination of the line representing an increase in the carburized amount (carburizing rate) is approximately constant across the cleaning steps performed. This leads to the determination that the cleaning step performed in accordance with the disclosure hardly cause excess carburizing and oxidation of the inside of the growth furnace. Moreover, the appearance check of the shower nozzle demonstrated that falling of carbon contaminants caused by excess carburizing did not occur even after the integrated operation time of approximately 60 days.

The aligned CNT aggregate manufactured in this Example had the following characteristics:

Yield: 1.8 to 2.2 mg/cm$^2$,

BET specific surface area: 1000 to 1300 m$^2$/g,

Density: 0.025 to 0.06 g/cm$^3$,

Outer diameter: 2.8 to 3.0 nm (half width: 2 nm),

Carbon purity: 99.9% or more,

Hermann's orientation factor: 0.7, and

G/D ratio obtained by Raman spectrum measurement: 4 to 6.

Figure 9:
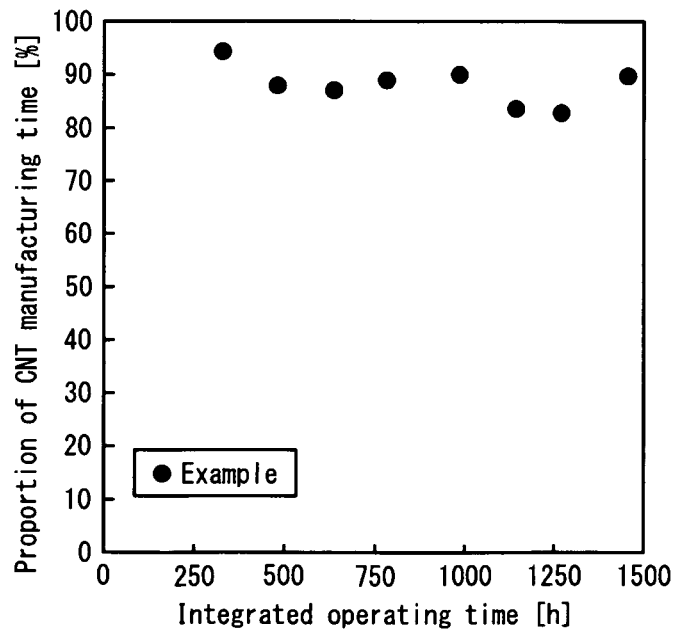
FIG. 9 is a graph showing the relationship between the integrated operating time and a rate of manufacturing time of the manufacturing apparatus used in the Example.

Based on the formula (proportion of manufacturing time)=(manufacturing time)/{(manufacturing time)+(cleaning time)}, the proportion of manufacturing time of the Example was calculated. The results are shown in FIG. 9. The proportion of manufacturing time and the integrated operating time of the Example shown in the graph of FIG. 9 is specified in Table 11 below (proportion of manufacturing time: %, integrated operating time: hour (h)).

TABLE 11

| Proportion of manufacturing time | Integrated operating time |
|---|---|
| 94 | 345 |
| 87 | 489 |
| 87 | 643 |
| 89 | 788 |
| 90 | 994 |
| 84 | 1141 |
| 83 | 1278 |
| 90 | 1460 |

FIG. 9 and Table 11 show that the proportion of manufacturing time was constant within a range of approximately 80% to 90% in the Example.

INDUSTRIAL APPLICABILITY

The CNTs obtained with the disclosed manufacturing method can be suitably used in fields such as electronic device materials, optical device materials, conducting materials, and the like.

REFERENCE SIGNS LIST

10 CNT manufacturing apparatus
12 Substrate
13 Growth furnace
14 Heater
15 Gas inlet
16 Gas outlet
100 CNT manufacturing apparatus

The invention claimed is:

1. A method of manufacturing carbon nanotubes by growing carbon nanotubes on a substrate that supports a catalyst on a surface thereof, comprising the steps of:
   growing carbon nanotubes on the substrate by supplying a source gas of carbon nanotubes to the catalyst of the substrate introduced into a growth furnace and heating at least one of the catalyst and the source gas; and
   cleaning the inside of the growth furnace by supplying a cleaning gas that contains water into the growth furnace, wherein
   in the cleaning step, the inside of the growth furnace is cleaned such that a hydrogen concentration [H$_2$], a carbon dioxide concentration [CO$_2$], and a carbon monoxide concentration [CO] in a gas within the growth furnace satisfy the following condition (1)

$$0.7 \leq \{(2[CO_2]+[CO])/[H_2]\} \leq 1.3 \qquad (1).$$

2. The method of manufacturing carbon nanotubes according to claim 1, wherein in the cleaning step, the inside of the growth furnace is cleaned such that the following condition (2):

$$0 < ([CO]/[CO_2]) \leq 10 \qquad (2)$$

is satisfied.

3. The method of manufacturing carbon nanotubes according to claim 2, wherein the cleaning step comprises monitoring [CO]/[CO$_2$] within the growth furnace.

4. The method of manufacturing carbon nanotubes according to claim 1, wherein the growth furnace at least partially contains metal.

5. The method of manufacturing carbon nanotubes according to claim 1, wherein the cleaning step comprises monitoring (2[CO$_2$]+[CO])/[H$_2$] within the growth furnace.

6. The method of manufacturing carbon nanotubes according to claim 1, wherein the growing step further comprises supplying a catalyst activating material to the catalyst of the substrate in addition to the source gas.

* * * * *